(12) United States Patent
Kondo

(10) Patent No.: US 6,983,092 B2
(45) Date of Patent: Jan. 3, 2006

(54) OPTICAL INTERCONNECTION CIRCUIT AMONG WAVELENGTH MULTIPLEXING CHIPS, ELECTRO-OPTICAL DEVICE, AND ELECTRONIC APPARATUS

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 97 days.

(21) Appl. No.: 10/722,441

(22) Filed: Nov. 28, 2003

(65) Prior Publication Data
US 2004/0264867 A1 Dec. 30, 2004

(30) Foreign Application Priority Data
Dec. 6, 2002 (JP) .............. 2002-355345

(51) Int. Cl.
*G02B 6/30* (2006.01)
*H04B 10/12* (2006.01)
(52) U.S. Cl. .............. 385/49; 385/24; 385/901; 398/141
(58) Field of Classification Search ............. 385/14, 385/24, 49, 15; 398/141
See application file for complete search history.

(56) References Cited

U.S. PATENT DOCUMENTS

| | | | | |
|---|---|---|---|---|
| 5,664,032 A | * | 9/1997 | Bischel et al. | 385/4 |
| 6,845,184 B1 | * | 1/2005 | Yoshimura et al. | 385/14 |
| 2003/0025962 A1 | * | 2/2003 | Nishimura | 359/124 |
| 2003/0128907 A1 | * | 7/2003 | Kikuchi et al. | 385/14 |
| 2004/0013358 A1 | * | 1/2004 | Zhang | 385/31 |

FOREIGN PATENT DOCUMENTS

JP          A 5-100246          4/1993

* cited by examiner

*Primary Examiner*—John D. Lee
*Assistant Examiner*—James D. Stein
(74) *Attorney, Agent, or Firm*—Oliff & Berridge, PLC

(57) ABSTRACT

To provide an optical interconnection circuit among wavelength multiplexing chips, capable of increasing signal transmission speed and of being easily made minute thereby being simply and easily fabricated, an electro-optical device, and an electronic apparatus, an optical interconnection circuit among wavelength multiplexing chips, which is disposed on a substrate, includes micro-tile shaped elements having a light emitting function or a light receiving function with wavelength selectivity.

14 Claims, 26 Drawing Sheets

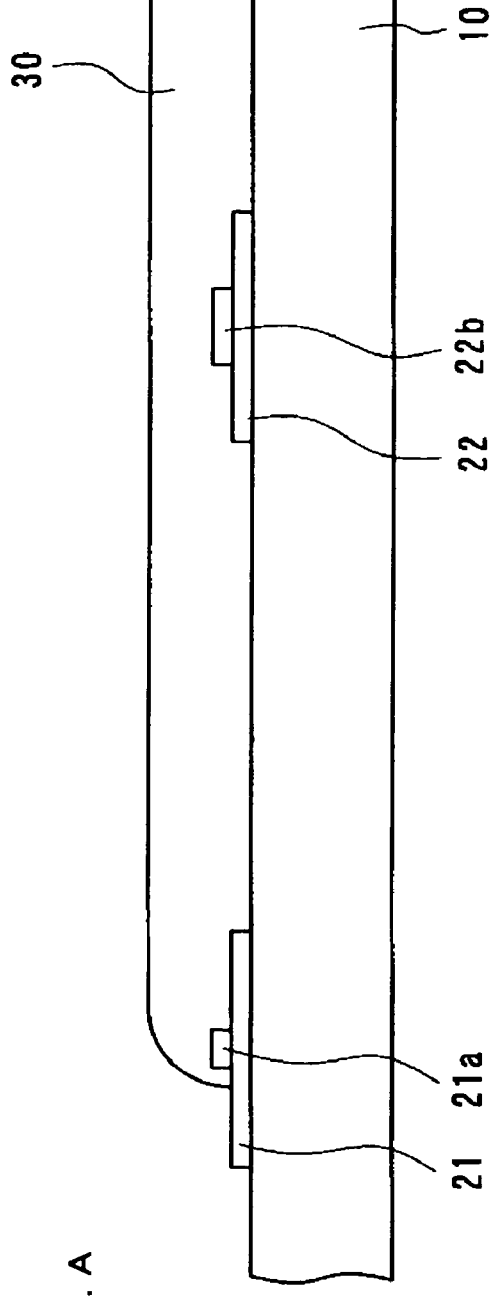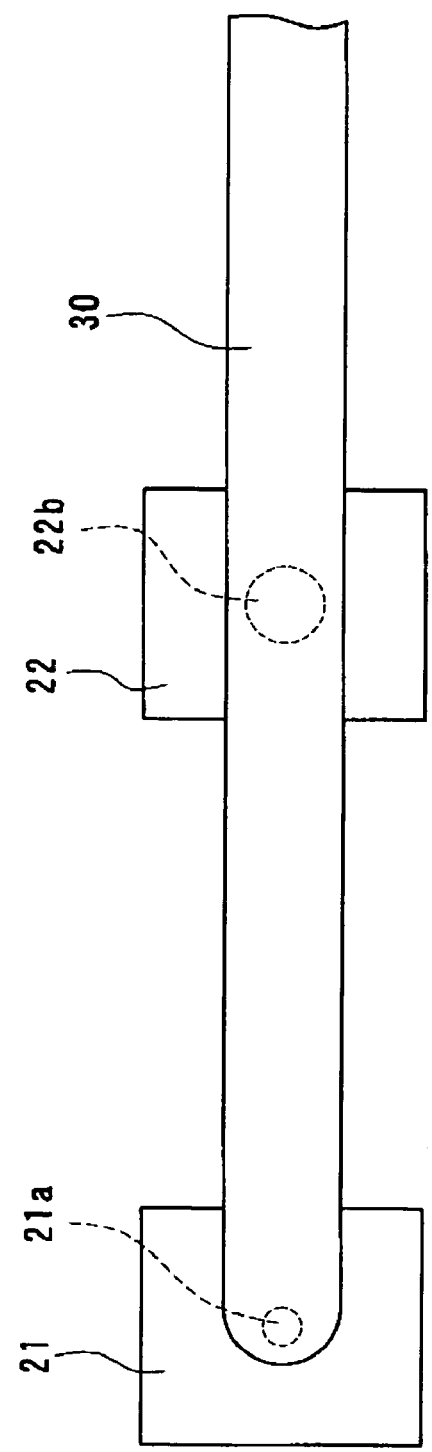

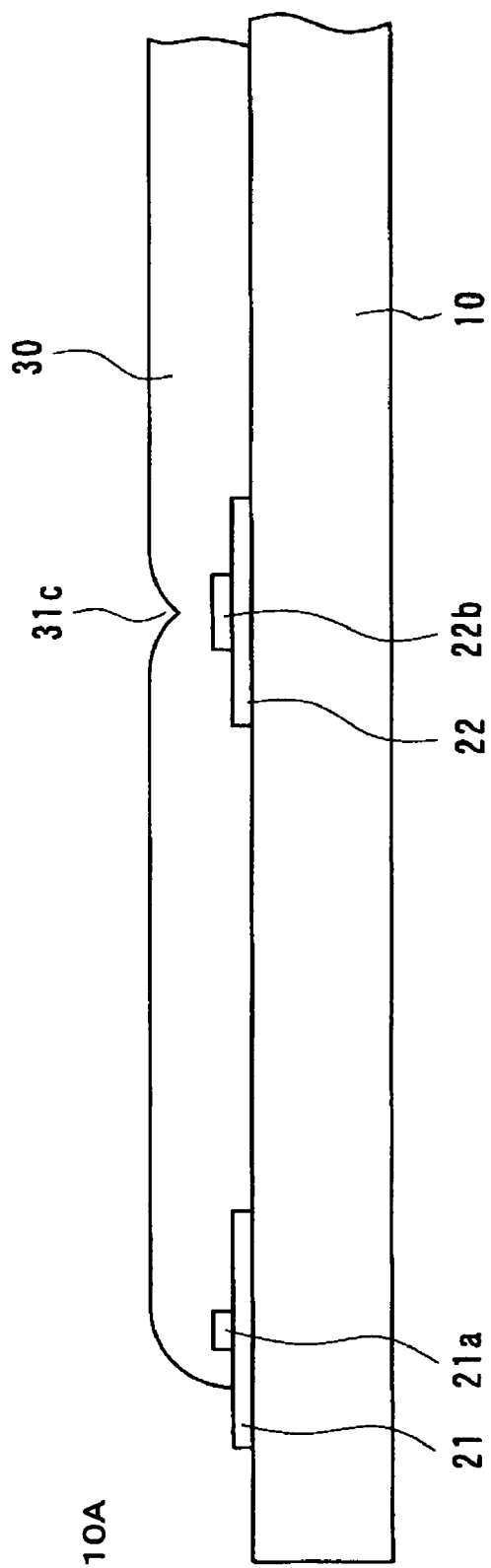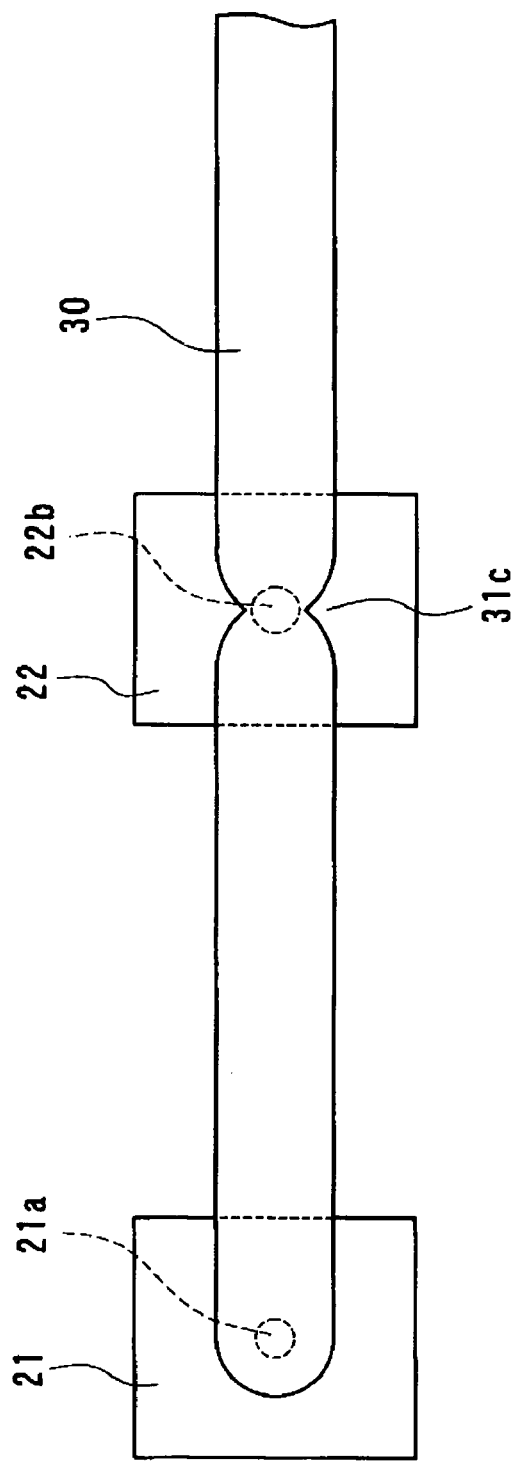

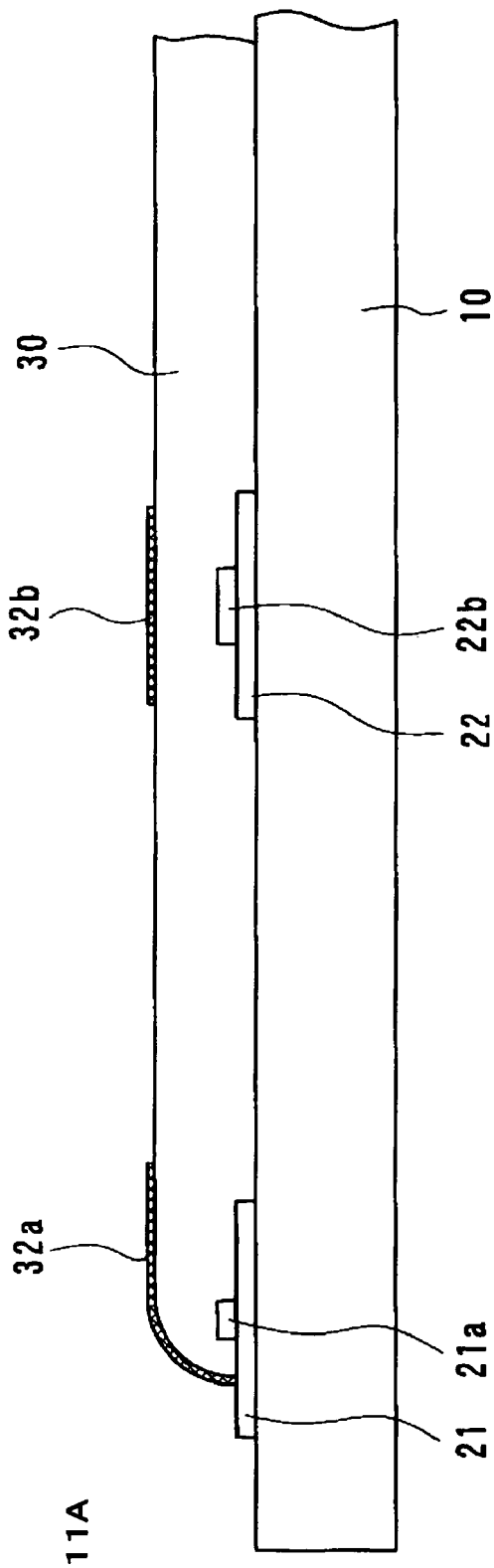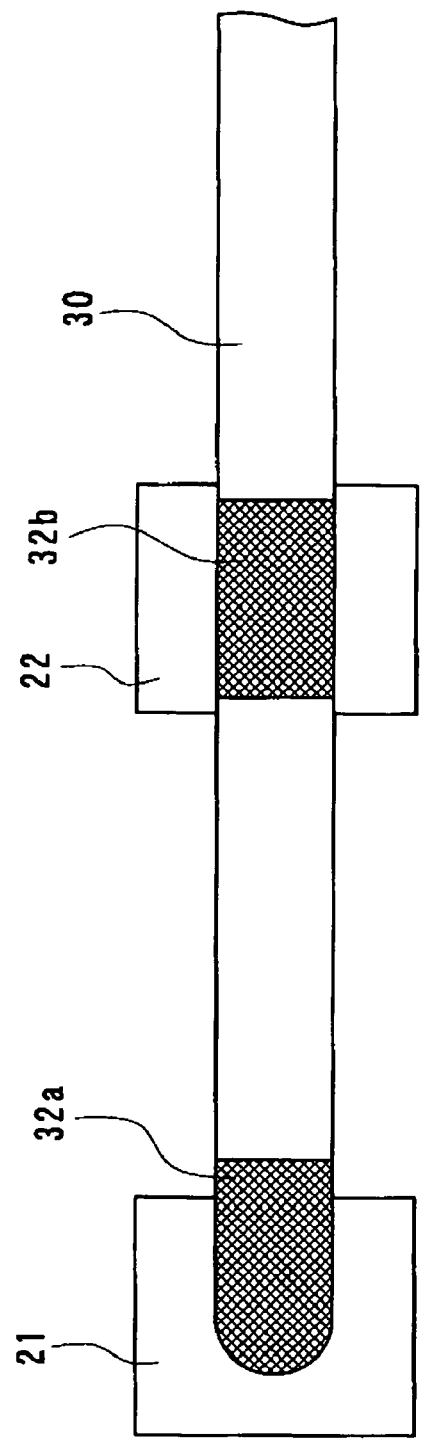

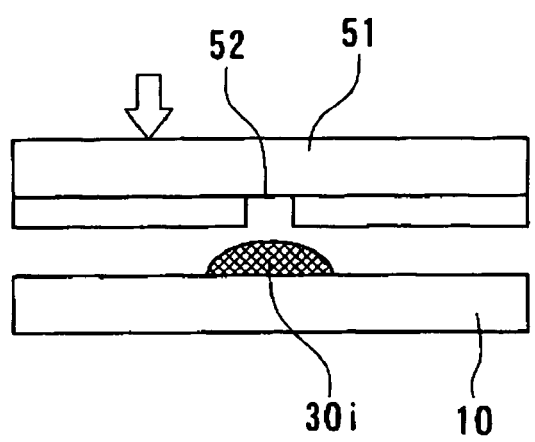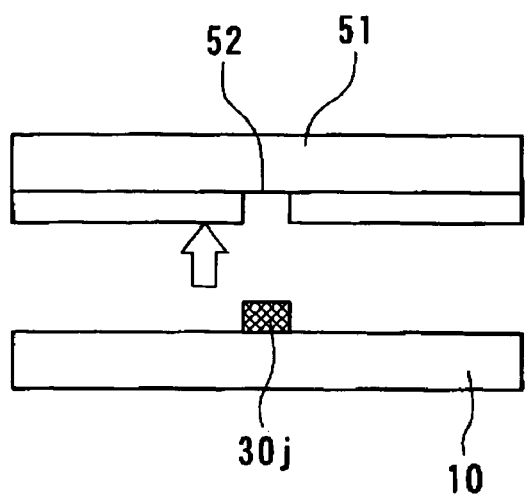

OPTICAL INTERCONNECTION CIRCUIT AMONG WAVELENGTH MULTIPLEXING CHIPS, ELECTRO-OPTICAL DEVICE, AND ELECTRONIC APPARATUS

BACKGROUND OF THE INVENTION

1. Field of Invention

The present invention relates to an optical interconnection circuit among wavelength multiplexing chips, an electro-optical device, and an electronic apparatus.

2. Description of Related Art

Electro-luminescence panels (ELPs), plasma display panels (PDPs), and liquid crystal displays (LCDs) are recently used as plane display devices. In such plane display devices, a technology of using light to transmit signals is used in order to address the problem of signal delay caused by an increase in the sizes of the plane display devices and large capacity display.

In computers, operation speed (an operation clock) inside CPUs increases year by year, as the internal structures of integrated circuits become minute. However, in buses to connect the CPUs to peripheral devices, such as memories, signal transmission speed substantially reaches its limit thereby becoming a bottleneck in the processing speed of computers. When optical signals are used to transmit signals among the buses, it is possible to remarkably enhance the processing speed of computers.

In order to transmit data using the optical signals, optical transmission devices to transmit the optical signals emitted from a light source to a predetermined place and inputting the transmitted optical signals to a light receiving element is required. In the related art, an optical fiber and an optical waveguide formed on a substrate are used as the optical transmission devices.

However, when optical fiber is used as the optical transmission device, connections between optical parts, such as a light emitting element and a light receiving element, are complicated. Therefore, it costs too much and takes long to fabricate the optical transmission device. Also, it is difficult to miniaturize the optical transmission device.

Therefore, it is considered to simplify the connections between optical transmission media and the light emitting element and the light receiving element using an optical waveguide formed on a substrate. However, input and output structures suitable for the optical waveguide have not yet been found. Optical transmission devices that are so minute and easily fabricated as to be applied to plane display devices or computers have not yet been realized.

To address the above problem, the present invention provides an optical interconnection circuit among wavelength multiplexing chips, an electro-optical device, and an electronic apparatus which are capable of increasing signal transmission speed and of being easily made minute thereby being simply and easily fabricated.

SUMMARY OF THE INVENTION

According to an aspect of the invention, an optical interconnection circuit among wavelength multiplexing chips, which is disposed on a substrate, includes micro-tile shaped elements having wavelength selectivity and a light emitting function or a light receiving function.

According to an aspect of the present invention, it is possible to transmit and receive optical signals having desired wavelengths using micro-tile shaped elements having wavelength selectivity. According to an aspect of the present invention, it is possible to perform wavelength multiplexing transmission by one optical communication path because it is possible to simultaneously transmit and receive a plurality of optical signals having different wavelengths using a plurality of micro-tile shaped elements.

According to an aspect of the present invention, it is possible to provide extremely compact wavelength multiplexing transmission devices because it is possible to extremely miniaturize the micro-tile shaped elements (for example, to have areas of several hundred micrometers square or less and thickness of several ten micrometers or less). It is possible to provide easily fabricated wavelength multiplexing transmission devices because it is possible to use the micro-tile shaped element as a data transmission device among integrated circuit chips.

The optical interconnection circuit among the wavelength multiplexing chips, which is disposed on the substrate, preferably includes optical waveguides optically connected to the micro-tile shaped elements.

According an aspect of to the present invention, it is possible to transmit light emitted from the micro-tile shaped element or light incident on the micro-tile shaped element in the optical waveguide by disposing the optical waveguide formed of transparent resin so as to pass over the micro-tile shaped element connected to a desired position on a substrate using an adhesive. According to an aspect of the present invention, it is possible to provide simple and compact wavelength multiplexing transmission devices.

In the optical interconnection circuit among wavelength multiplexing chips of an aspect of the invention, the optical waveguides preferably include branches and are made of resin.

According to an aspect of the present invention, it is possible to simply form an optical waveguide having a branch using resin. Also, according to an aspect of the present invention, since the optical waveguide has the branch, it is possible to easily optically connect a plurality of micro-tile shaped elements scattered on the substrate to each other in one optically connected optical waveguide. According to an aspect of the present invention, it is possible to effectively transmit the optical signals in the optical waveguide, to which the plurality of micro-tile shaped elements are connected. Therefore, it is possible to enhance optical coupling efficiency in the optical waveguide.

In the optical interconnection circuit among wavelength multiplexing chips of an aspect of the invention, the optical waveguides are preferably disposed on the substrate.

According to an aspect of the present invention, it is possible to simply and easily increase the number of optical signals (wavelengths) that can be simultaneously transmitted and received using the plurality of optical waveguides and thereby to simply provide signal transmission devices of higher speed.

It is preferable that in the optical interconnection circuit among wavelength multiplexing chips of an aspect of the invention, the micro-tile shaped elements having the light emitting function be optically connected to the optical waveguides. Therefore, the micro-tile shaped elements with the light emitting function preferably have different emitted light wavelengths.

According to an aspect of the present invention, it is possible to arrange the plurality of micro-tile shaped elements on a substrate to be close to each other and thereby to simply provide extremely compact optical multiplexing signal transmission devices.

It is preferable that in the optical interconnection circuit among wavelength multiplexing chips of an aspect of the invention, the micro-tile shaped elements having the light emitting function simultaneously input optical pulse signals having a plurality of emitted light wavelengths to one of the optical waveguides.

According to an aspect of the present invention, it is possible to simply provide extremely compact optical multiplexing signal transmission devices using the one optical waveguide and the plurality of micro-tile shaped elements.

It is preferable that in the optical interconnection circuit among wavelength multiplexing chips of an aspect of the invention the micro-tile shaped elements having the light receiving function be optically connected to one of the optical waveguides. Therefore, the micro-tile shaped elements with the light receiving function preferably have different received light wavelengths.

According to an aspect of the present invention, it is possible for each of the plurality of micro-tile shaped elements connected to the same optical waveguide and having the light receiving function to selectively receive data (an optical signal having a specific wavelength) that is destinated thereto without crosstalk.

In the optical interconnection circuit among wavelength multiplexing chips of an aspect of the invention, integrated circuit chips are preferably mounted on the substrate. Therefore, it is preferable that the integrated circuit chips and the micro-tile shaped elements be electrically connected to each other by wiring lines on the substrate.

According to an aspect of the present invention, with respect to input and output signals of the IC chip, it is possible to convert an electric signal into an optical signal or an optical signal into an electric signal by the micro-tile shaped element. Therefore, according to an aspect of the present invention, it is possible to increase data transmission speed between the IC chip and other circuits with a compact and simple structure.

In the optical interconnection circuit among wavelength multiplexing chips of an aspect of the invention, the integrated circuit chips are preferably mounted on the substrate by a flip-chip technique.

According to an aspect of the present invention, it is possible to simply and compactly mount the IC chip on the substrate. For example, it is possible to form a bonding pad that functions as an electrode on the surface of the substrate, to form a convex conductive bump on the bonding pad, and to mount the IC chip on the bump by a flip-chip technique.

In the optical interconnection circuit among wavelength multiplexing chips of an aspect of the invention, the substrate is a constituent of a flat panel display. At least timing-control integrated circuits and driver integrated circuits are preferably mounted on the substrate as the integrated circuit chips. Therefore, the optical waveguides are preferably disposed to connect the timing-control integrated circuits to the driver integrated circuits.

According to an aspect of the present invention, in the flat panel display, it is possible to connect the timing control circuit to generate signals (such as a data signal and a scanning signal) to control each pixel based on an image signal to the driver IC (such as a data line driver IC and a scanning line driver IC) to drive each pixel by amplification by receiving signals output from the timing control circuit in the optical waveguide. It is possible to simultaneously transmit a plural kinds of data signals and scanning signals in one optical waveguide.

Therefore, according to an aspect of the present invention, it is possible for a compact flat panel display to transmit the data signal and the scanning signal at high speed, thereby to generate a larger number of pixels than in the related art. As a result, it is possible to provide a high picture quality display device.

According to an aspect of the present invention, it is possible to drive a micro-tile shaped element having a light emitting function by a simple and easy driver. Therefore, it is possible to simplify the circuit structure of the flat panel display and thereby to reduce fabricating costs.

According to an aspect of the present invention, it is possible to transmit an image signal by an optical signal. Therefore, it is possible to significantly reduce the amount of electromagnetic waves emitted from screens and thereby to significantly reduce the generation of electromagnetic interference (EMI).

In the optical interconnection circuit among wavelength multiplexing chips of an aspect of the invention, the driver integrated circuits are preferably mounted on the substrate. Each of the driver integrated circuits preferably include a branch in the optical waveguide.

According to an aspect of the present invention, it is possible to transmit the data signal or the scanning signal incident on one optical waveguide from the timing control circuit to each driver IC through each branch. Therefore, according to an aspect of the present invention, it is possible to enhance the optical coupling efficiency of the optical waveguide and thereby to simplify the structure of the flat panel display.

In the optical interconnection circuit among wavelength multiplexing chips of an aspect of the invention, the timing-control integrated circuits preferably include the micro-tile shaped elements having the light emitting function. Therefore, the micro-tile shaped elements having the light emitting function preferably emit light components having different wavelengths and are optically connected to common optical waveguides.

According to an aspect of the present invention, the timing control circuit is electrically connected to the plurality of micro-tile shaped elements emitting light components having different wavelengths (such as wavelengths $\lambda 1$, $\lambda 2$, ..., and $\lambda n$). Therefore it is possible to simultaneously transmit a plurality of optical signals (such as the data signal and the scanning signal) in one optical waveguide.

In the optical interconnection circuit among wavelength multiplexing chips of an aspect of the invention, the driver integrated circuits preferably include the micro-tile shaped elements having different received light wavelengths.

According to an aspect of the present invention, it is possible for each driver IC to receive a desired optical signal (one among the wavelengths $\lambda 1$, $\lambda 2$, ..., and $\lambda n$) by transmitting the plurality of optical signals (such as the data signal and the scanning signal, for example, the wavelengths $\lambda 1$, $\lambda 2$, ..., and $\lambda n$) in the optical waveguide. Therefore, it is possible for each driver IC to receive an optical signal that is destinated thereto from the plurality of optical signals simultaneously transmitted in one optical waveguide.

An electro-optical device according to an aspect of the present invention includes the optical interconnection circuit among the wavelength multiplexing chips.

According to an aspect of the present invention, in the electro-optical device, such as a liquid crystal display, an electro-luminescence panel, and a plasma display, it is possible to use the optical interconnection circuit among the wavelength multiplexing chips as the timing control circuit and the driver IC. According to an aspect of the present invention, it is possible to transmit the scanning signal and the data signal of the electro-optical device by the optical interconnection circuit among the wavelength multiplexing chips and thereby to control the driving of each pixel at high speed. In the plane display device, it is possible to make screens larger, have higher quality, and be more compact.

An electronic apparatus according to an aspect of the present invention includes the optical interconnection circuit among the wavelength multiplexing chips.

In an electronic apparatus according to an aspect of the present invention, a module where CPUs and memory circuits are formed of the IC chips and the IC chips are connected to each other by the optical interconnection circuit among the wavelength multiplexing chips is included. Therefore, it is possible to process signals at higher speed than in the related art. Also, because the electronic apparatus is compact, it is possible to provide high performance electronic apparatuses at low prices.

According to an aspect of the present invention, for example, it is possible to provide compact electronic apparatuses capable of displaying high quality pictures at low prices by applying the optical interconnection circuit among the wavelength multiplexing chips to a display device.

BRIEF DESCRIPTION OF THE DRAWINGS

FIGS. 6(A) and 6(B) are a side view and a plan view of constituents of circuit according to the exemplary embodiments of the present invention;

FIGS. 10(A) and 10(B) are a side view and a plan view illustrating a modification of the constituents of the circuit illustrated in FIG. 1;

FIGS. 11(A) and 11(B) are a side view and a plan view illustrating another modification of the constituents of the circuit illustrated in FIG. 1;

FIGS. 17(A) and 17(B) are schematic side views illustrating another fabricating method according to an exemplary embodiment of the present invention;

DETAILED DESCRIPTION OF PREFERRED EMBODIMENTS

Optical interconnection circuits among wavelength multiplexing chips in accordance with exemplary embodiments of the present invention are described in detail with reference to the accompanying figures.

First Exemplary Embodiment

Figure 1:
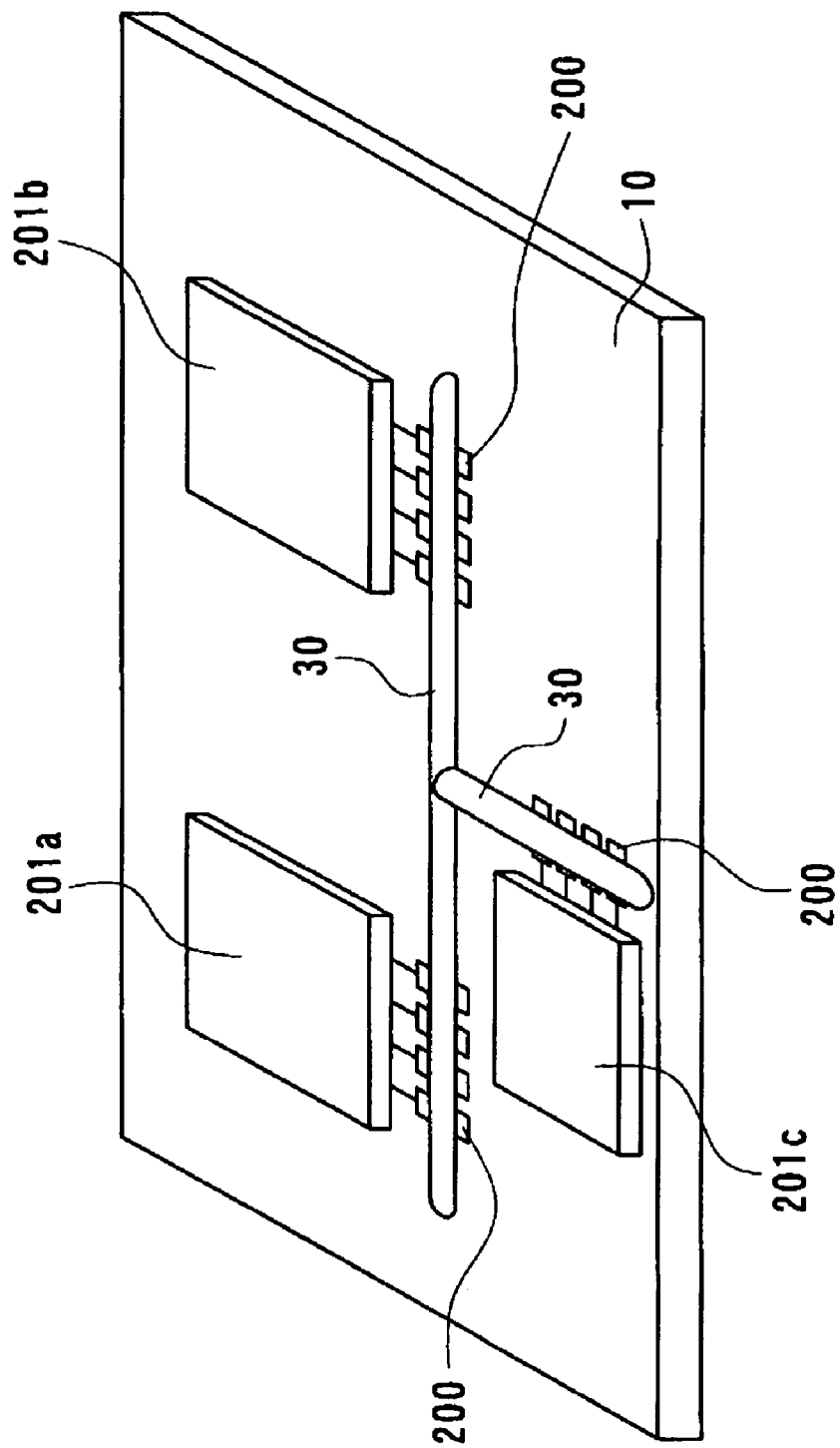
FIG. 1 is a perspective view illustrating a circuit according to a first exemplary embodiment of the present invention.
Figure 2:
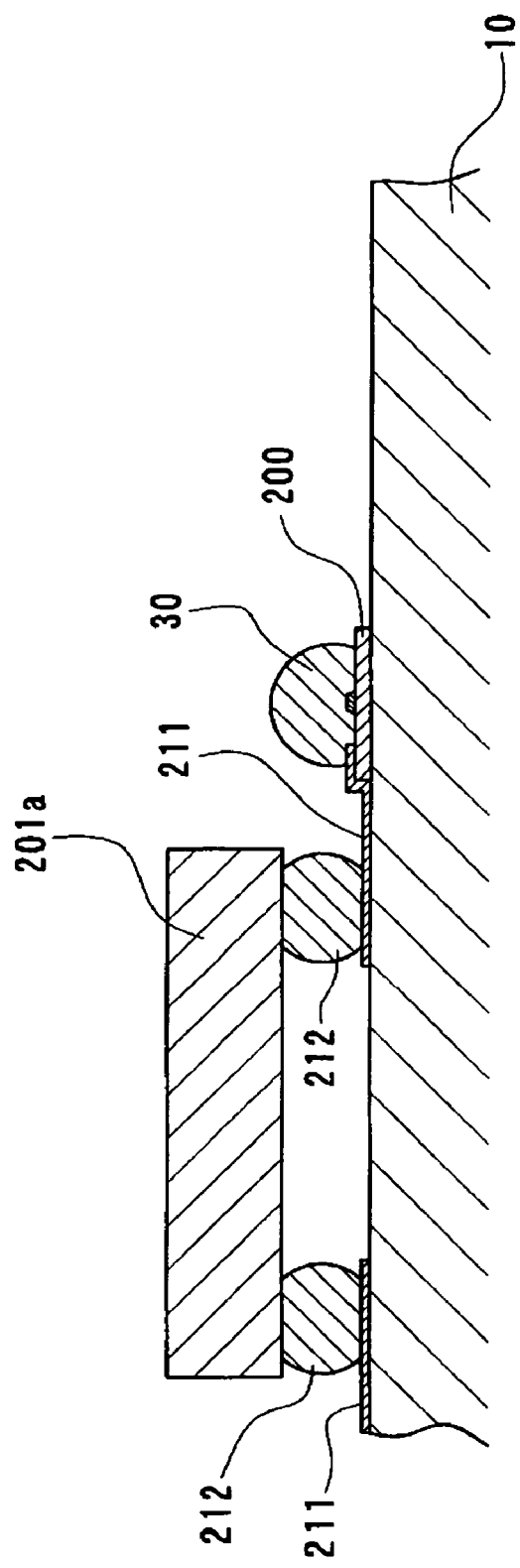
FIG. 2 is a cross-sectional view of a main portion of the circuit illustrated in FIG. 1.

FIG. 1 is a perspective view illustrating an optical interconnection circuit among wavelength multiplexing chips in accordance with a first exemplary embodiment of the present invention. FIG. 2 is a cross-sectional view of a main portion of the optical interconnection circuit among wavelength multiplexing chips illustrated in FIG. 1.

A plurality of integrated circuit chips (LSI chips or IC chips) 201a, 201b, and 201c are mounted on the surface of a substrate 10. The integrated circuit chips 201a, 201b, and 201c form a CPU, a memory circuit, an image signal processing circuit, an image signal driving circuit, a communication I/O, various interface circuits, an analog-to-digital (A/D) converter, and a digital-to-analog (D/A) converter. In FIG. 1, three integrated circuit chips 201a, 201b, and 201c are mounted on the substrate 10. However, the present invention is not limited thereto. Glass epoxy, ceramic, glass, plastic, semiconductor, polyimide, and silicon can be used as the substrate 10.

A plurality of micro-tile shaped elements 200 are adhered to around the integrated circuit chips 201a, 201b, and 201c, on the surface of the substrate 10 by an adhesive. The micro-tile shaped element 200 is a micro-tile shaped semiconductor device having a light emitting function or a light receiving function. The micro-tile shaped element 200 having the light emitting function includes a vertical cavity surface emitting laser (VCSEL), a built-in distributed feedback (DFB) laser to absorb and modulate electric fields, or a light emitting diode (LED). The micro-tile shaped element having the light receiving function includes, for example, a photodiode or a phototransistor. For example, the micro-tile shaped element 200 is formed of a plate having a thickness of 20 $\mu$m or less and being several ten micrometers to several hundred micrometers long and wide. An exemplary method of fabricating the micro-tile shaped element 200 is described below.

The light emitting function or the light receiving function of each micro-tile shaped element 200 has wavelength selectivity. For example, a micro-tile shaped element emitting light having a wavelength $\lambda 1$, a micro-tile shaped element emitting light having a wavelength $\lambda 2$, a micro-tile shaped element emitting light having a wavelength $\lambda n$, a micro-tile shaped element receiving the light having the wavelength $\lambda 1$, a micro-tile shaped element receiving the light having the wavelength $\lambda 2$, and a micro-tile shaped element receiving the light having the wavelength $\lambda n$, are adhered as the micro-tile shaped elements 200. The wavelength selectivity of each micro-tile shaped element 200 can be realized by providing a film that forms a band pass filter or a color filter that transmits only the light having a specific wavelength on the light emitting surface or the light receiving surface of the micro-tile shaped element 200.

An optical waveguide 30 formed of an optical waveguide material is disposed on the surface of the substrate 10. Transparent resin and sol-gel glass can be used as the optical waveguide material. The optical waveguide 30 is formed to be connected to each micro-tile shaped element 200 and to pass over the micro-tile shaped elements 200. The micro-tile shaped elements 200 are optically connected to each other by the optical waveguide 30. Therefore, the optical signal having the wavelength $\lambda 1$ emitted from the micro-tile shaped element 200 is transmitted in the optical waveguide 30 and is received by the micro-tile shaped element 200 that receives the light having the wavelength $\lambda 1$. A branch illustrated in FIG. 1 may be disposed in the optical waveguide 30. The optical waveguide 30 may be curved. In FIG. 1, one optical waveguide 30 is disposed. However, a plurality of optical waveguides 30 may be disposed on one substrate 10.

As illustrated in FIG. 2, the integrated circuit chips 201a, 201b, and 201c are mounted on the surface of the substrate 10 by a flip-chip technique. The micro-tile shaped element 200 is adhered to the substrate 10 through the adhesive. Electrodes 211 are disposed so as to be electrically connected to the micro-tile shaped element 200. An integrated circuit chip 201a is connected to the electrodes 211 through bumps 212 or the like. The integrated circuit chip 201a is electrically connected to the micro-tile shaped element 200. The electrodes 211 are disposed on the surface of the substrate 10 and may be formed of a bonding pad connected to the bumps 212 and a metal wiring line connected to the micro-tile shaped element 200. It is not limited that the bumps 212 are directly connected to the electrodes 211. The bumps 212 may be connected to the electrodes 211 through solder or conductive paste.

In the above structure, for example, electric signals (pulse signals) output from the integrated circuit chip 201a pass through the bumps 212 and the electrodes 211 and are transmitted to the micro-tile shaped elements 200. The electric signals are converted into, for example, optical pulse signals having the wavelength $\lambda 1$ by the micro-tile shaped element 200 and are emitted into the optical waveguide 30. The optical pulse signals having the wavelength $\lambda 1$ are transmitted in the optical waveguide 30 and are converted into electric signals by the micro-tile shaped elements 200 that are connected to the integrated circuit chips 201b and 201c and receive light having the wavelength $\lambda 1$. The electric signals are input to the integrated circuit chips 201b and 201c.

Similar to the above-mentioned operation, a plurality of electric signals output from the integrated circuit chip 201a are converted into a plurality of optical pulse signals having the wavelengths $\lambda 1$, $\lambda 2$, and $\lambda n$ by the plurality of micro-tile shaped elements 200 connected to the integrated circuit chip 201a. The plurality of optical pulse signals is simultaneously transmitted in the optical waveguide 30. The optical pulse signal having the wavelength $\lambda 1$ is converted into an electric signal by the micro-tile shaped element 200 that is connected to the integrated circuit chips 201b and 201c and receives the light having the wavelength $\lambda 1$ and is input to the integrated circuit chips 201b and 201c. The optical pulse signal having the wavelength $\lambda 2$ is converted into an electric signal by the micro-tile shaped element 200 that is connected to the integrated circuit chips 201b and 201c and receives the light having the wavelength $\lambda 2$ and is input to the integrated circuit chips 201b and 201c. The optical pulse signal having the wavelength $\lambda n$ is converted into an electric signal by the micro-tile shaped element 200 that is connected to the integrated circuit chips 201b and 201c and receives the light having the wavelength $\lambda n$ and is input to the integrated circuit chips 201b and 201c. That is, the optical pulse signal having each wavelength is transmitted from and received to between desired micro-tile shaped elements 200 without cross talk.

Therefore, according to the present exemplary embodiment, it is possible to perform wavelength multiplexing transmission, by which a plurality of optical pulse signals, having different wavelengths, are independently and in parallel, transmitted to among the integrated circuit chips 201a, 201b, and 201c using one optical waveguide 30 and the plurality of micro-tile shaped elements 200. According to the present exemplary embodiment, it is possible to perform data transmission among the integrated circuit chips 201a, 201b, and 201c at extremely high speed. Therefore, it is possible to provide an optical interconnection circuit among wavelength multiplexing chips capable of being compactly and easily fabricated.

According to the above exemplary embodiment, an aspect of the present invention is applied to the data transmission among the integrated circuit chips 201a, 201b, and 201c. However, the present invention is not limited thereto. The optical interconnection circuit among the wavelength multiplexing chips according to an aspect of the present invention may be applied to between the integrated circuit chips and the circuits disposed on the substrate 10.

Second Exemplary Embodiment

Figure 3:
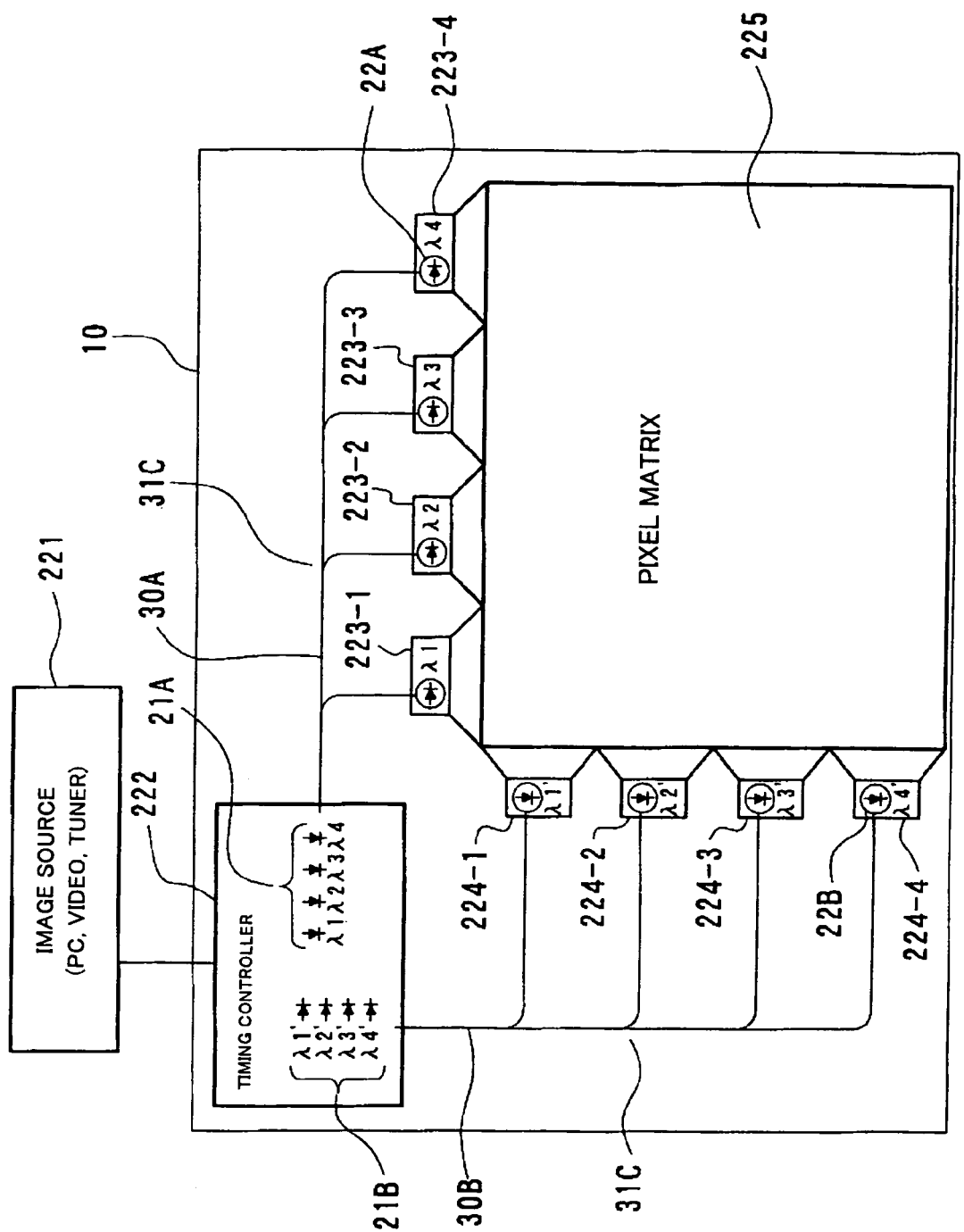
FIG. 3 is a circuit schematic of a FDP according to a second exemplary embodiment of the present invention.
Figure 4:
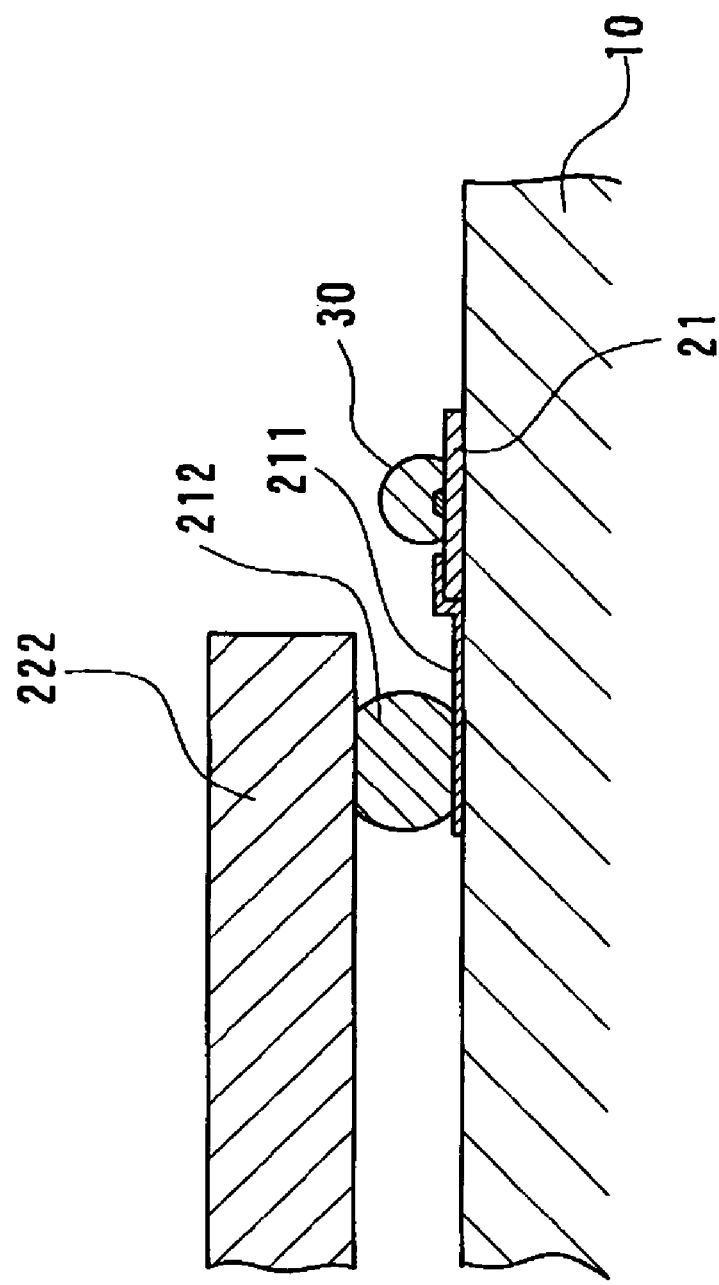
FIG. 4 is a cross-sectional view of a main portion of the circuit illustrated in FIG. 3.
Figure 5:
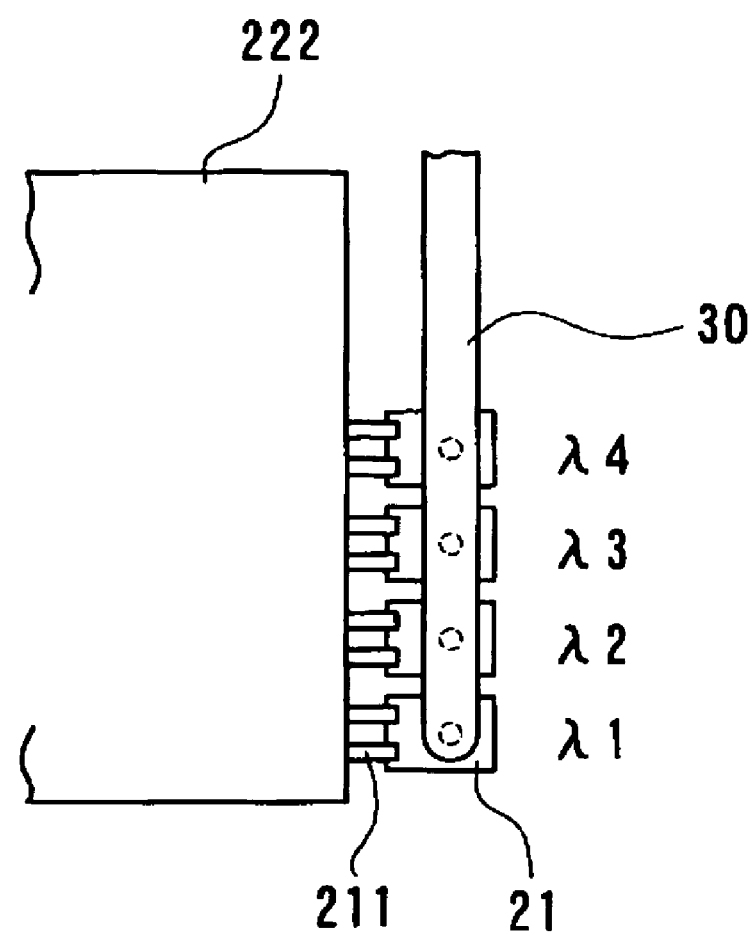
FIG. 5 is a plan view of the main portion of the circuit illustrated in FIG. 3.

An application example of an optical interconnection circuit among wavelength multiplexing chips according to a second exemplary embodiment of the present invention will now be described with reference to FIGS. 3 to 5. According to the present exemplary embodiment, a timing control circuit and a driver circuit of a flat panel display (FPD) are connected to each other by an optical waveguide 30. FIG. 3 is a circuit schematic of a flat panel display, which illustrates an application example of the optical interconnection circuit among wavelength multiplexing chips according to the second exemplary embodiment of the present invention.

The substrate 10 is a constituent of the flat panel display. Glass and plastic may be used as the substrate 10. A timing control circuit 222, a plurality of (for example, four) data line driver circuits 223-1, 223-2, 223-3, and 223-4, a plurality of (for example, four) scanning line driver circuits 224-1, 224-2, 224-3, and 224-4, and a pixel matrix (a display surface) 225 are disposed on the substrate 10. An output terminal of an image source 221 (such as a personal computer, a video, and a tuner) is connected to an input terminal of the timing controller circuit 222.

The timing controller circuit 222, the data line driver circuits 223-1, 223-2, 223-3, and 223-4, and the scanning line driver circuits 224-1, 224-2, 224-3, and 224-4 are formed of the integrated circuit chips corresponding to the integrated circuit chips 201a, 201b, and 201c of FIG. 1. Therefore, the timing-controller circuit 222, the data line driver circuits 223-1, 223-2, 223-3, and 223-4, and the scanning line driver circuits 224-1, 224-2, 224-3, and 224-4 are preferably mounted on the substrate 10 by a flip-chip technique.

One optical waveguide 30A is disposed on the substrate 10 so as to connect the timing control circuit 222 to the data line driver circuits 223-1, 223-2, 223-3, and 223-4. The optical waveguide 30A corresponds to the optical waveguide 30 according to the first exemplary embodiment. Each of the data line driver circuits 223-1, 223-2, 223-3, and 223-4 has a branch.

One optical waveguide 30B is disposed on the substrate 10 so as to connect the timing control circuit 222 to the scanning line driver circuits 224-1, 224-2, 224-3, and 224-4. The optical waveguide 30B corresponds to the optical waveguide 30 according to the first exemplary embodiment. Each of the scanning line driver circuits 224-1, 224-2, 224-3, and 224-4 has a branch.

The timing control circuit 222 has a plurality of first micro-tile shaped elements 21A having the light emitting function, which are optically connected to the optical waveguide 30A. The first micro-tile shaped elements 21A correspond to the micro-tile shaped elements 200 having the light emitting function according to the first exemplary embodiment. The first micro-tile shaped elements 21A convert data signals (electric signals) among the output signals of the timing control circuit 222 into optical pulse signals. The plurality of (for example, four) first micro-tile shaped elements 21A emits optical pulse signals having wavelengths $\lambda 1$, $\lambda 2$, $\lambda 3$, and $\lambda 4$.

The timing control circuit 222 includes a plurality of first micro-tile shaped elements 21B having the light emitting function, which is optically connected to the optical waveguide 30B. The first micro-tile shaped elements 21B correspond to the micro-tile shaped elements 200 having the light emitting function according to the first exemplary embodiment. Therefore, the first micro-tile shaped elements 21B are the output device of the timing control circuit 222. The first micro-tile shaped elements 21B convert scanning signals (electric signals) among the output signals of the timing control circuit 222 into optical pulse signals. The plurality of (for example, four) first micro-tile shaped elements 21B emits optical pulse signals having wavelengths $\lambda 1'$, $\lambda 2'$, $\lambda 3'$, and $\lambda 4'$.

Each of the data line driver circuits 223-1, 223-2, 223-3, and 223-4 includes one of second micro-tile shaped elements 22A having the light receiving function, which are optically connected to the branch of the optical waveguide 30A. The second micro-tile shaped elements 22A correspond to the micro-tile shaped elements 200 having the light receiving function according to the first exemplary embodiment. Therefore, the micro-tile shaped elements 22A are the input device of the data line driver circuits 223-1, 223-2, 223-3, and 223-4.

For example, the first data line driver circuit 223-1 includes the second micro-tile shaped element 22A that selectively receives the optical pulse signal having the wavelength $\lambda 1$ among the plurality of data signals transmitted in the optical waveguide 30A. The second data line driver circuit 223-2 includes the second micro-tile shaped element 22A that selectively receives the optical pulse signal having the wavelength $\lambda 2$. The third data line driver circuit 223-3 includes the second micro-tile shaped element 22A that selectively receives the optical pulse signal having the wavelength $\lambda 3$. The fourth data line driver circuit 223-4 includes the second micro-tile shaped element 22A that selectively receives the optical pulse signal having the wavelength $\lambda 4$.

Each of the scanning line driver circuits 224-1, 224-2, 224-3, and 224-4 includes one of the second micro-tile shaped elements 22B having the light receiving function, which are optically connected to the branch of the optical waveguide 30B. The second micro-tile shaped elements 22B correspond to the micro-tile shaped elements 200 having the light receiving function according to the first exemplary embodiment. Therefore, the micro-tile shaped elements 22B are the input device of the scanning line driver circuit.

For example, the first scanning line driver circuit 224-1 includes the second micro-tile shaped element 22B that selectively receives the optical pulse signal having the wavelength $\lambda 1'$ among the plurality of scanning signals transmitted to the optical waveguide 30B. The second scanning line driver circuit 224-2 includes the second micro-tile shaped element 22B that selectively receives the optical pulse signal having the wavelength $\lambda 2'$. The third scanning line driver circuit 224-3 includes the second micro-tile shaped element 22B that selectively receives the optical pulse signal having the wavelength $\lambda 3'$. The fourth scanning line driver circuit 224-4 includes the second micro-tile shaped element 22B that selectively receives the optical pulse signal having the wavelength $\lambda 3'$.

The operation of the flat panel display having the above structure will now be described. An image signal output from the image source 221 is input to the timing control circuit 222. The timing control circuit 222 processes the input image signal and generates, for example, four kinds of data signals and four kinds of scanning signals. Among the generated signals, the four kinds of data signals are converted into four optical pulse signals having the wavelengths $\lambda 1$, $\lambda 2$, $\lambda 3$, and $\lambda 4$ by the four first micro-tile shaped elements 21A. The four kinds of scanning signals are converted into four optical pulse signals having the wavelengths $\lambda 1'$, $\lambda 2'$, $\lambda 3'$, and $\lambda 4'$ by the four first micro-tile shaped elements 21B.

The four optical pulse signals having the wavelengths $\lambda 1$, $\lambda 2$, $\lambda 3$, and $\lambda 4$ are simultaneously incident on the optical waveguide 30A and are transmitted throughout the optical waveguide 30A. The optical pulse signal having the wavelength $\lambda 1$ is received to the second micro-tile shaped element 22A disposed in the first data line driver circuit 223-1. At the same time, the optical pulse signal having the wavelength λ2 is received to the second micro-tile shaped element 22A disposed in the second data line driver circuit 223-2. At the same time, the optical pulse signal having the wavelength λ3 is received to the second micro-tile shaped element 22A disposed in the third data line driver circuit 223-3. At the same time, the optical pulse signal having the wavelength λ4 is received to the second micro-tile shaped element 22A disposed in the fourth data line driver circuit 223-4.

The data line driver circuits 223-1, 223-2, 223-3, and 223-4 convert optical pulse signals (data signals) having predetermined wavelengths into electric signals and input the electric signals to the second micro-tile shaped elements 22A. The data line driver circuits 223-1, 223-2, 223-3, and 223-4 output data signals to the assigned plurality of data lines among the plurality of data lines (not shown) arranged in the pixel matrix 225.

The four optical pulse signals having the wavelengths λ1', λ2', λ3', and λ4' are simultaneously incident on the optical waveguide 30B and are transmitted throughout the optical waveguide 30B. The optical pulse signal having the wavelength λ1' is received to the second micro-tile shaped element 22B disposed in the first scanning line driver circuit 224-1. At the same time, the optical pulse signal having the wavelength λ2' is received to the second micro-tile shaped element 22B disposed in the second scanning line driver circuit 224-2. At the same time, the optical pulse signal having the wavelength λ3' is received to the second micro-tile shaped element 22B disposed in the third scanning line driver circuit 224-3. At the same time, the optical pulse signal having the wavelength λ4' is received to the second micro-tile shaped element 22B disposed in the fourth scanning line driver circuit 224-4.

The scanning line driver circuits 224-1, 224-2, 224-3, and 224-4 convert optical pulse signals (scanning signals) having predetermined wavelengths into electric signals and input the electric signals to the second micro-tile shaped elements 22B. The scanning line driver circuits 224-1, 224-2, 224-3, and 224-4 output scanning signals to the plurality of assigned scanning lines among the plurality of scanning lines (not shown) arranged in the pixel matrix 225.

The respective pixels of the pixel matrix 225 are sequentially driven and controlled by the data signals output from the data line driver circuits 223-1, 223-2, 223-3, and 223-4 and the scanning signals output from the scanning line driver circuits 224-1, 224-2, 224-3, and 224-4. Therefore, an image is displayed on the pixel matrix 225.

As mentioned above, according to the present exemplary embodiment, the timing control circuit 222 and the data line driver circuits 223-1, 223-2, 223-3, and 223-4 are wavelength multiplexing connected through one optical waveguide 30A. The timing control circuit 222 and the scanning line driver circuits 224-1, 224-2, 224-3, and 224-4 are wavelength multiplexing connected to each other by one optical waveguide 30B. Therefore, it is possible to provide a compact flat panel display having a larger number of pixels than in the related art, thereby having high picture quality.

The scanning lines and the data lines arranged in the pixel matrix 225 formed of electric wiring lines so as to be used for a related art flat panel display, however, may be formed of the optical waveguide 30 according to the above exemplary embodiment. When the scanning lines and the data lines arranged in the pixel matrix 225 are formed of the optical waveguide 30, the micro-tile shaped elements having the light emitting function are provided in the output portions of the data line driver circuits 223 and the output portions of the scanning line driver circuits 224. At the same time, the micro-tile shaped elements having the light receiving function are preferably provided as the signal receiving device of the respective pixels to receive signals from the scanning lines and the data lines.

According to the present exemplary embodiment, signal transmission is performed by light. Therefore, it is possible to perform data transmission at high speed with respect to a connection between a timing IC (the timing control circuit 222) and driver ICs (the data line driver circuit 223 and the scanning line driver circuit 224), in which a wiring line distance is relatively long like in the flat panel display.

According to the present exemplary embodiment, it is possible to transmit image signals by optical signals. Therefore, it is possible to significantly reduce electromagnetic waves emitted from screens and thereby to significantly reduce the generation of electromagnetic interference (EMI).

In the flat panel display according to the present exemplary embodiment, a CPU and a memory formed of integrated circuit chips may be formed on the substrate 10. The CPU and the memory are preferably mounted on the substrate 10 as the integrated circuit chips 201a, 201b, and 201c illustrated in FIG. 1. Data transmission among the integrated circuit chips 201a, 201b, and 201c and data transmission between the integrated circuit chips 201a, 201b, and 201c and the timing control circuit 222 are preferably performed using the optical waveguide 30. By doing so, it is possible to provide a compact and high performance computer system, in which an information processing device and the flat panel display are integrated.

According to the above exemplary embodiment, the second micro-tile shaped elements 22A and 22B receive light wavelength selectivity. However, the present invention is not limited thereto. Branches 31C of the optical waveguides 30A and 30B may have a wavelength selecting function. For example, band pass filters or color filters may be disposed in the branches 31C or the branches. Wavelength selecting half mirrors may be disposed in the branches 31C.

According to the present exemplary embodiment, a configuration example of mounting the integrated circuit chips that form the timing control circuit 222 on the substrate 10 in the flip chip technique will now be described in detail. According to the following configuration example, the integrated circuit chips that form the data line driver circuits 223-1, 223-2, 223-3, and 223-4 and the scanning line driver circuits 224-1, 224-2, 224-3, and 224-4 may be mounted on the substrate 10 in the flip chip technique. FIG. 4 is a cross-sectional view of a main portion, which illustrates a configuration example when the timing control circuit 222 is mounted on the substrate in the flip chip technique. FIG. 5 is a plan view of the main portion of the configuration example illustrated in FIG. 4.

The timing control circuit 222 formed of the integrated circuit (IC) chips is mounted on the substrate 10 in the flip chip technique. A first micro-tile shaped element 21 is adhered to the substrate 10. The electrode 211 is disposed so as to be electrically connected to the first micro-tile shaped element 21. The timing control circuit 222 is connected to the electrode 211 while interposing the bump 212. The first micro-tile shaped element 21 is electrically connected to the timing control circuit 222. The electrode 211 may be formed of a bonding pad disposed on the surface of the substrate 10 and connected to the bump 212 and a metal wiring line connected to the first micro-tile shaped element 21. It is not limited that the bump 212 is directly connected to the electrode 211. However, the bump 212 may be connected to the electrode 211 while interposing solder or conductive paste.

Either the input terminal of the timing control circuit 222 or the output terminal of the timing control circuit 222 is electrically connected to the bump 212. As illustrated in FIG. 5, the plurality of (for example, four) first micro-tile shaped elements 21 may be adhered onto the substrate 10 around the timing control circuit 222. The optical waveguide 30 is disposed so as to surround the plurality of first micro-tile shaped elements 21.

The four first micro-tile shaped elements 21 emit the optical pulse signals having the wavelengths λ1, λ2, λ3, and λ4. The electrode 211 is disposed in and is electrically connected to, each of the first micro-tile shaped elements 21. The bump 212 is disposed in and is electrically connected, to each of the electrodes 211.

According to such a configuration, for example, four kinds of data signals generated by the timing control circuit 222 are output to each of the bumps 212. The data signals are input to the first micro-tile shaped elements 21 interposing the electrodes 211, are considered as the optical pulse signals having the wavelengths λ1, λ2, λ3, and λ4, and are simultaneously emitted to the optical waveguide 30.

According to the present exemplary embodiment, it is possible to use a method of mounting the timing IC (the timing control circuit 222) and the driver ICs (the data line driver circuit 223 and the scanning line driver circuit 224) in a common flip chip technique. Therefore, it is possible to realize high-speed optical data transmission while matching to a related art mounting method. According to the present exemplary embodiment, it is possible to compactly and easily form an optical bus by wavelength multiplexing using one optical waveguide 30.

Optical Interconnection Circuit

An optical interconnection circuit that is a constituent of the optical interconnection circuit among the wavelength multiplexing chips according to the exemplary embodiment will now be described in detail.

FIG. 6 illustrates the optical interconnection circuit according to the present exemplary embodiment. FIG. 6(a) is a schematic side view. FIG. 6(b) is a schematic plan view. The optical interconnection circuit according to the present exemplary embodiment includes the first micro-tile shaped elements 21 and the second micro-tile shaped elements 22 adhered to the surface of the substrate 10 and the optical waveguide 30 formed of an optical waveguide material on the surface of the substrate 10, so as to connect the first micro-tile shaped elements 21 to the second micro-tile shaped elements 22. The same members illustrated in FIGS. 1 to 5, according to the above exemplary embodiment, are denoted by the same reference numerals. Transparent resin and sol-gel glass may be used as the optical waveguide material that forms the optical waveguide 30. Glass epoxy, ceramic, plastic, polyimide, silicon, and glass may be used as the substrate 10.

The first micro-tile shaped element 21 includes a light emitting part 21a capable of emitting light. The second micro-tile shaped element 22 includes a light receiving part 22b capable of receiving light. Accordingly, at least the light emitting part 21a of the first micro-tile shaped element 21 and the light receiving part 22b of the second micro-tile shaped element 22 are covered with the optical waveguide material, which constitutes the optical waveguide 30.

With such configuration, the light emitted from the light emitting part 21a of the first micro-tile shaped element 21 propagates along the optical waveguide 30 and reaches the light receiving part 22b of the second micro-tile shaped element 22. Accordingly, when an optical signal is emitted from the light emitting part 21a by controlling the light emitting operation of the light emitting part 21a, the optical signal propagates along the optical waveguide 30, and the optical signal can be detected from the light receiving part 22b.

Further, the optical signal emitted from the first micro-tile shaped element 21 propagates along the optical waveguide 30 and is incident on the second micro-tile shaped element 22. Furthermore, the signal passes through the second micro-tile shaped element 22. As a result, it is possible to almost simultaneously transmit optical signals from one first micro-tile shaped element 21 to a plurality of second micro-tile shaped elements 22. Herein, when a thickness of the second micro-tile shaped element 22 is set to 20 μm or less, the step difference between the substrate and the second micro-shaped element becomes sufficiently small. Thus, as shown in FIG. 6, the optical waveguide 30 can be formed consecutively regardless of the step difference. When the optical waveguide 30 is formed consecutively at the step portion, light transmission loss, such as scattering can be neglected because the step difference is sufficiently small. For such reason, a specific configuration or an optical element to alleviate the step difference is unnecessary. Thus, it is possible to simply and cheaply fabricate it. Further, the thickness of the optical waveguide material forming the optical waveguide 30 can be several ten or less micrometers.

The first micro-tile shaped element 21 includes, for example, an LED, a VCSEL (vertical cavity surface emitting laser), and a DFB laser having an electric field absorbing modulator. Although the LED has the simplest structure and the easiest fabrication step as a light emitting device, the modulation speed of the optical signals is as slow as several hundred Mbps. In contrast, because the VCSEL has an extremely high modulation speed of 10 Gbps or more, a small threshold current, and high light-emitting efficiency, it is possible to drive it with a low power consumption. In the DFB laser, although modulation speed is 1 Gbps, less than that of the VCSEL, it is possible to transmit optical signals with higher efficiency than the VCSEL since laser beam is emitted from the end of the micro-tile shape in a direction parallel to the plane of the substrate 10, i.e., in a direction along the optical waveguide 30.

The second micro-tile shaped element 22 includes, for example, a photodiode or a phototransistor. Herein, as the photodiode, a PIN type photodiode, an APD (Avalanche Photo Diode), an MSM type photo diode can be selected for use. The APD has high photosensitivity and response frequency. The MSM type photodiode has a simple structure and is easily integrated with an amplifying transistor.

Further, a third micro-tile shaped element (not shown), which is composed of a light receiving element, may be formed to overlap the first micro-tile shaped element 21. When being formed in such a manner, the quantity of light emitted from the first micro-tile shaped element 21 is monitored by the third micro-tile shaped element, and then the monitored value is fed back to the first micro-tile shaped element 21. As a result, APC function is attained, so stable optical data transmission can be achieved. Alternatively, the APC function may be built in the first micro-tile shaped element 21 itself. Further, it is desirable that the second micro-tile shaped element 22 should have an amplifying circuit to amplify the detected signals. As a result, it is possible to further enhance the efficiency of the apparatus.

Hence, the first micro-tile shaped element 21 and the second micro-tile shaped element 22 are electrically connected to an electronic circuit (not shown), such as an integrated circuit, an EL display circuit, a plasma display, a liquid crystal display circuit, and the like, which are provided on the substrate 10. As a result, the computer system including integrated circuits can be compact and have higher operation speed than the related art. Further, by the optical interconnection circuit according to the present exemplary embodiment, it is possible to transmit the scanning signals of a planar display provided on the substrate 10 at high speed and to achieve the planar display device having the enlarged screen and high quality images.

In FIG. 6, although each of the first micro-tile shaped element 21 and the second micro-tile shaped element 22 is coupled to one optical waveguide 30, a plurality of the second micro-tile shaped elements 22 may be connected thereto. In such a case, it is possible for optical signals emitted from one first micro-tile shaped element 21 (light emitting element) to propagate along the optical waveguide 30 and to be simultaneously detected at the plurality of second micro-tile shaped elements 22. This is equal to the bus line for plural elements.

In addition, a plurality of the first micro-tile shaped elements 21 and a plurality of the second micro-tile shaped elements 22 may be formed. In such a case, it is preferable that the wavelength of light emitted from each of the first micro-tile shaped elements 21 be different. It is desirable that each of the second micro-tile shaped elements 22 should be a light receiving device capable of selecting a wavelength corresponding to that of the light emitted from at least one first micro-tile shaped element 21. As a result, it is possible for optical signals emitted from the first micro-tile shaped elements 21 to propagate along the optical waveguide 30 simultaneously and to be detected by the respective second micro-tile shaped elements 22. Thus, it is possible to simply and easily constitute a bus capable of transmitting and receiving optical signals in parallel.

In addition, while being formed in a liner shape shown in FIG. 6, the optical waveguide 30 may be formed in a curved shape or in a branch shape. Further, the optical waveguide 30 may be formed in a loop shape. The optical waveguide 30 may be formed in a sheet shape to cover the plurality of tile-shaped elements. To be sure, it is also possible for plural sets of the first micro-tile shaped element 21, the second micro-tile shaped element 22, and the optical waveguide 30 to be formed on the top surface of one substrate 10. Moreover, it is also possible for the first micro-tile shaped element 21, the second micro-tile shaped element 22, and the optical waveguide 30 to be formed on both of the front and back surfaces of the substrate 10.

Figure 7:
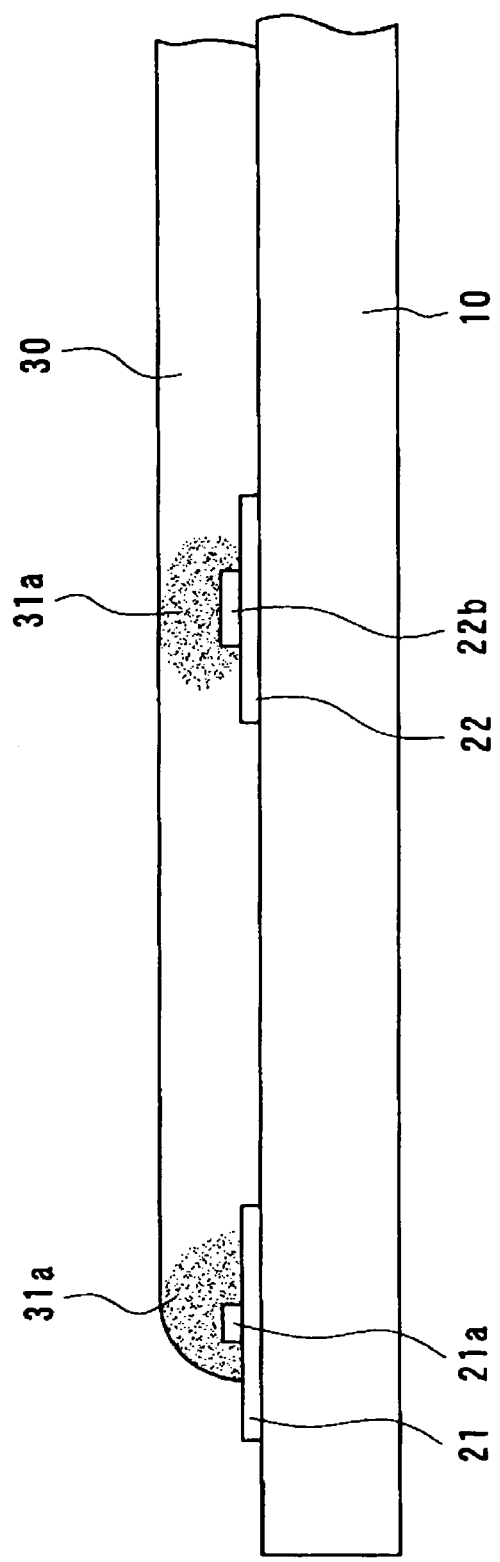
FIG. 7 is a side view illustrating a modification of the constituents of the circuit illustrated in FIG. 1.

A modified example of the optical interconnection circuit according to the present exemplary embodiment will be described with reference to FIGS. 7 to 10. Unlike the exemplary embodiment of FIG. 6, the present exemplary embodiment has a light scattering frame to scatter light at the optical waveguide 30 positioned in the neighborhood of the first micro-tile shaped element 21 and the second micro-tile shaped element 22. FIG. 7 is a schematic side view illustrating a modified example of the optical interconnection circuit according to the present exemplary embodiment.

In the optical interconnection circuit, light scattering particles forming a light scattering frame 31a are dispersed in the neighborhood of the first micro-tile shaped element 21 and the second micro-tile shaped element 22, in the optical waveguide material forming the optical waveguide 30. For example, silica particle, glass particle, metal particle, and the like may be used as the light scattering particle. The optical waveguide 30 having such light scattering frame 31a uses a liquid droplet discharging manner to discharge a liquid droplet from, for example, a dispenser, an inkjet nozzle, and the like. Specifically, the optical waveguide 30 having such a light scattering frame 31a is formed by discharging a liquid optical waveguide material (such as resin) from one inkjet nozzle to a desired portion and then by discharging a liquid optical waveguide material containing light scattering particles from another inkjet nozzle to a desired portion.

Further, except for resin, sol gel glass can be used as a material forming the optical waveguide 30. A method of fabricating the sol gel glass includes the steps of: adding an acid to metal alkoxide to form a liquid mixture; hydrolyzing the liquid mixture; applying the hydrolyzed solution to a desired portion; and adding energy, such as heat, so as to make glass.

Figure 8:
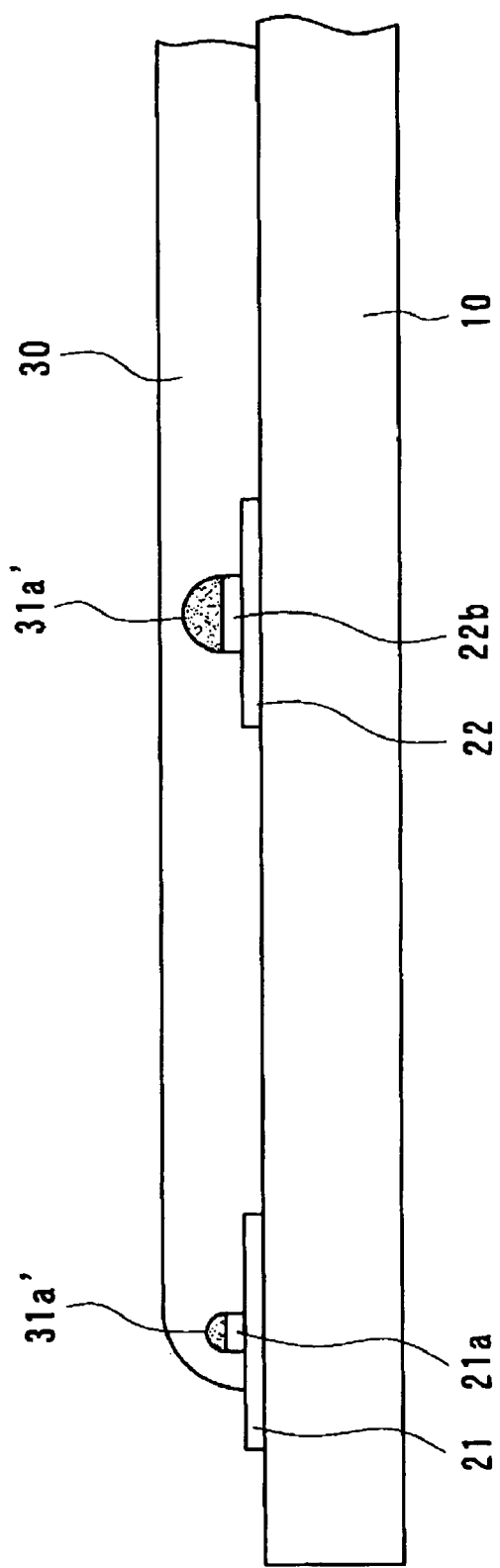
FIG. 8 is a side view illustrating another modification of the constituents of the circuit illustrated in FIG. 1.

FIG. 8 is a schematic side view illustrating another modified example of the optical interconnection circuit according to the present exemplary embodiment. A light scattering frame 31a' of the optical interconnection circuit is a dome-shaped light scattering frame made of resin or glass, in which light scattering particles are dispersed. An optical waveguide 30 is formed to cover such light scattering frame 31a' (the dome-shaped light scattering frame). It is possible to easily adjust the optical coupling efficiency between the optical waveguide 30 and a first micro-tile shaped element 21 or a second micro-tile shaped element 22 because as compared with the light scattering frame 31a in FIG. 7, it is easy to control the size and shape of such light scattering frame 31a'.

Next, a method of fabricating the light scattering frame 31a' will be described. First, an acid is added to metal alkoxide, such as liquid resin or silica ethyl containing light scattering particles, using an inkjet, a dispenser, and the like, and the liquid mixture is hydrolyzed. Then the hydrolyzed solution is applied to a desired portion of a substrate 10 in a dome shape. Then, energy, such as heat, is supplied to the applied portion to make the solution hardened or glassed. As a result, the light scattering frame 31a' having a dome shape is formed on the first micro-tile shaped element 21 and the second micro-tile shaped element 22. Next, a linear-shaped optical waveguide 30 is formed using transparent resin or sol gel glass to cover the light scattering frame 31a' having a dome shape.

Figure 9:
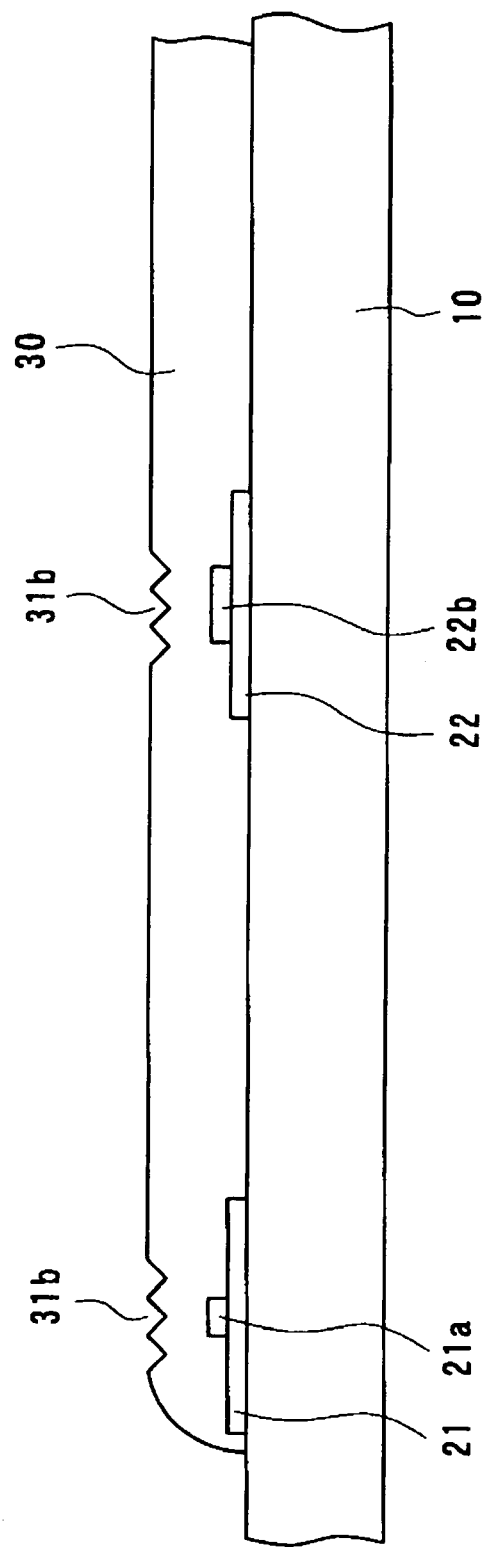
FIG. 9 is a side view illustrating still another modification of the constituents of the circuit illustrated in FIG. 1.

FIG. 9 is a schematic side view illustrating another modified example of the optical interconnection circuit according to the present exemplary embodiment. A light scattering frame 31b of the optical interconnection circuit has a configuration in which a surface of an optical waveguide material forming an optical waveguide 30 has concave and convex portions. Such a light scattering frame 31b is also formed in the neighborhood of a first micro-tile shaped element 21 and a second tile-shaped element 22. Herein, the concave and convex portions constituting the light scattering frame 31b are formed by an embossing process or a stamper transfer.

FIG. 10 illustrates a modified example of the optical interconnection circuit according to the present exemplary embodiment. FIG. 10(a) is a schematic side view thereof, and FIG. 10(b) is a schematic plan view thereof. A light scattering frame 31c of the optical interconnection circuit has a configuration in which the line width and height of a linear optical waveguide material forming an optical waveguide 30 vary. That is, in the optical waveguide 30, the line width and height of the optical waveguide material is narrow in the neighborhood of a light receiving part 22b of the second micro-tile shaped element 22.

Hereinafter, an exemplary method of fabricating the optical waveguide 30 having the light scattering frame 31c will be described. First, a first micro-tile shaped element 21 and the second micro-tile shaped 22 adhere to a predetermined portion of the surface of the substrate 10. Then, liquid repellent treatment is performed to the entire surface of the substrate 10 and the entire surfaces of the first micro-tile shaped element 21 and the second micro-tile shaped 22. Next, on the surface subjected to the liquid repellent treatment, the liquid lyophilic treatment is performed to a portion in which the optical waveguide 30 is formed. Herein, a portion subjected to a lyophilic treatment has a linear shape having a partly narrowed line width in the neighborhood of the light receiving part 22b of the second micro-tile shaped element 22. Further, the lyophilic treatment is executed by, for example, the radiation of UV light.

Next, a liquid optical waveguide material is dropped from the inkjet nozzle to the inside of the portion subjected to the lyophilic treatment. Accordingly, the dropped optical waveguide material is permeated into the portion subjected to the lyophilic treatment and is repelled from the portion subjected to the liquid repellent treatment, and surface tension acts thereto. As a result, such optical waveguide material becomes a linear shape having a narrowed width portion in the neighborhood of the light receiving part 22b as shown in FIG. 10.

As described above, in the optical waveguide 30, by providing the light scattering frames 31a, 31b, and 31c in the neighborhood of the first micro-tile shaped element 21, it is possible that the optical signals emitted from the first micro-tile shaped element 21 are scattered from the light scattering frames 31a, 31b, 31c and effectively propagate along the whole optical waveguide. Further, by providing the light scattering frames 31a, 31b, 31c in the neighborhood of the second micro-tile shaped element 22, it is possible that optical signals, which have propagated along the optical waveguide 30, are scattered in the neighborhood of the second micro-tile shaped element 22 and are effectively incident on the second micro-tile shaped element 22.

Next, still another modified example of the optical interconnection circuit according to the present exemplary embodiment will be described with reference to FIGS. 11 to 13. Unlike the exemplary embodiment described above, the present exemplary embodiment has light reflecting frames to reflect light at the neighborhood of a first micro-tile shaped element 21 and a second micro-tile shaped element 22 in an optical waveguide 30 or at the end of the optical waveguide 30. FIG. 11 illustrates a modified example of the optical interconnection circuit according to the present exemplary embodiment. FIG. 11(a) is a schematic side view thereof, and FIG. 11(b) is a schematic plan view thereof.

For example, the light reflecting frames 32a, 32b are formed by forming a metal film over the surface of an optical waveguide material forming the optical waveguide 30. In addition, the light reflecting frames 32a, 32b may be formed by applying paints containing metal fine particles over the surface of the optical waveguide material forming the optical waveguide 30. Fine particles, such as silver, aluminum, magnesium, copper, nickel, titanium, chrome, and zinc, are applied as the metal fine particles. Paints may be discharged from the inkjet nozzle to form the metal film forming the light reflecting frames 32a, 32b and to apply paints containing the metal fine particles. The light reflecting frame 32a and the light reflecting frame 32b may be formed over the whole optical waveguide 30.

With such a configuration, the optical signals emitted from the first micro-tile shaped element 21 are reflected from the light reflecting frame 32a in a direction along the optical waveguide 30, and a part of the optical signals is reflected again from the light reflecting frame 32b to the direction of the second micro-tile shaped element 22. Thus, according to the present exemplary embodiment, it is possible to effectively transmit optical signals.

Figures 12A, 12B:
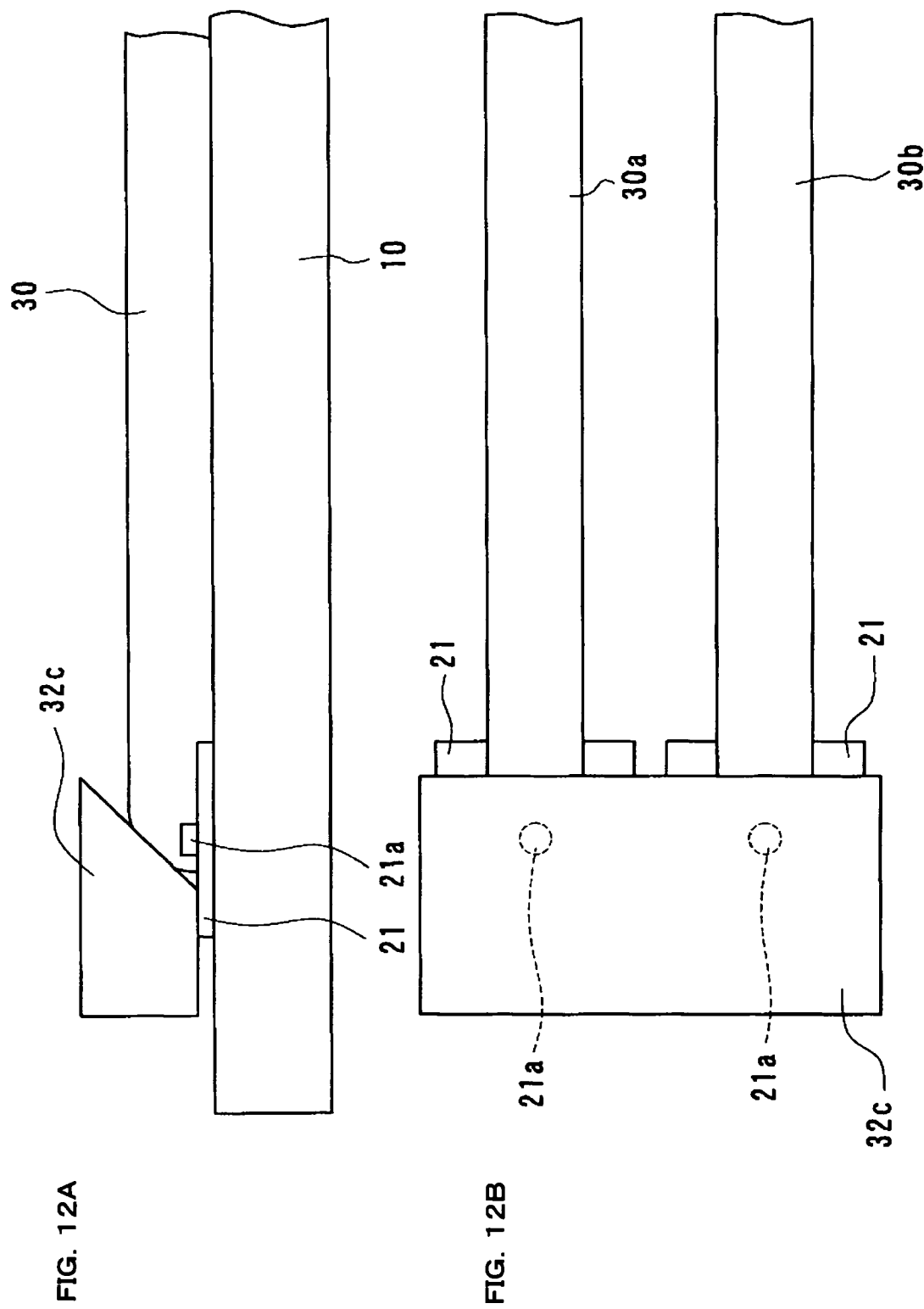
FIGS. 12(A) and 12(B) are a side view and a plan view illustrating still another modification of the constituents of the circuit illustrated in FIG. 1.

FIG. 12 illustrates still another modified example of the optical interconnection circuit according to the present exemplary embodiment. FIG. 12(a) is a schematic side view thereof, and FIG. 12(b) is a schematic plan view thereof. A light reflecting frame 32c of the optical interconnection circuit has a configuration in which a reflecting plate with a reflecting surface is attached to an end of the optical waveguide 30. Herein, the reflecting surface of the reflecting frame 32c is provided to incline, e.g., 45° with respect to the surface of the substrate 10.

Further, two optical waveguide 30a and 30b, which are parallel to each other, are provided in the optical interconnection circuit. Moreover, the light reflecting plate 32c is composed of a common reflecting plate which is provided at one end of two optical waveguides 30a, 30b and is commonly used for the two optical waveguides 30a, 30b. Thus, the optical signals emitted from each of two first micro-tile shaped elements 21 are reflected by the light reflecting frame 32c in a direction along the optical waveguides 30a, 30b, respectively. As a result, according to the present exemplary embodiment, it is possible to effectively transmit optical signals and to effectively fabricate an optical interconnection circuit.

Moreover, in FIG. 12, although the common reflecting frame 32c to two optical waveguides 30a, 30b is provided, the common light reflecting frame 32c to three or more optical waveguides may preferably be provided.

Figures 13A, 13B:
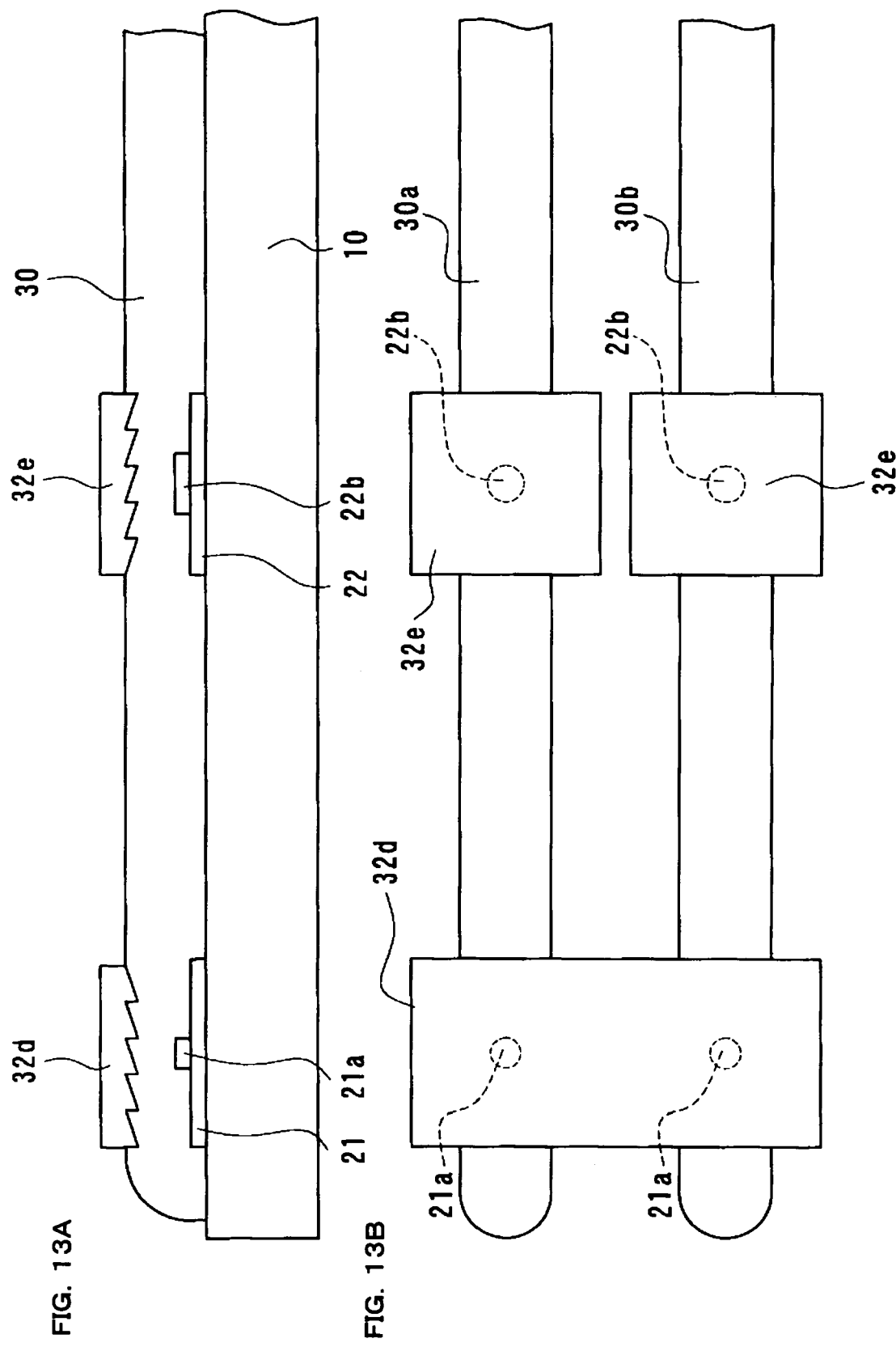
FIGS. 13(A) and 13(B) are a side view and a plan view illustrating still another modification of the constituents of the circuit illustrated in FIG. 1.

FIG. 13 illustrates still another modified example of the optical interconnection circuit according to the present exemplary embodiment. FIG. 13(a) is a schematic side view thereof, and FIG. 13(b) is a schematic plan view thereof. Light reflecting frames 32d, 32e of the present optical interconnection circuit are plate-shaped optical components (grating components) in which grating is performed. On the optical waveguide 30, the light reflecting frame 32d is provided to cover the first micro-tile shaped element 21, and the light reflecting frame 32e is provided to cover the second micro-tile shaped element 22.

Herein, when the distance between an optical waveguide 30a and an optical waveguide 30b is relatively large, as shown in FIG. 13, light reflecting frames 32e are individually attached to the optical waveguides 30a, 30b. When the optical waveguide 30a and the optical waveguide 30b are provided to be close and almost parallel to each other, as shown in FIG. 13, a light reflecting frame 32d may be attached in common to the optical waveguide 30a and the optical waveguide 30b.

In the light scattering frames and light reflecting frames illustrated in FIGS. 7 to 13, it is effective to use a combination thereof.

Fabricating Method

Next, a method of fabricating the optical waveguide 30 of the optical interconnection circuit according to the present exemplary embodiment will be described with reference to FIGS. 14 to 17. FIG. 14 is a schematic illustrating a method of fabricating the optical waveguide 30.

Figure 14A:
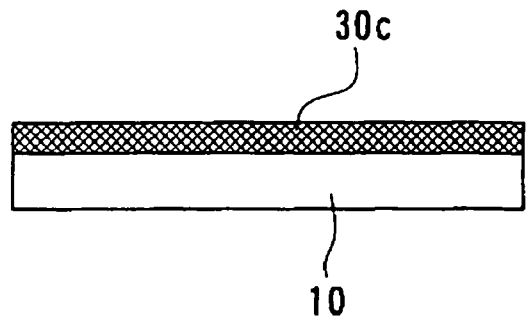
FIGS. 14(A) and 14(B) are schematic side views illustrating a fabricating method in accordance with an exemplary embodiment of the present invention.

First, the first micro-tile shaped element and the second micro-tile shaped element are attached to the top surface of the substrate 10. Then, a process to fabricate the optical waveguide 30 is performed. As shown in FIG. 14(a), photo-curable resin 30c in a liquid state is coated over the entire surface of the substrate 10 and the surfaces of the first micro-tile shaped element and the second micro-tile shaped element (not shown). Such coating may be performed by a spin coating method, a roll coating method, a spray coating method, and the like.

Figure 14B:
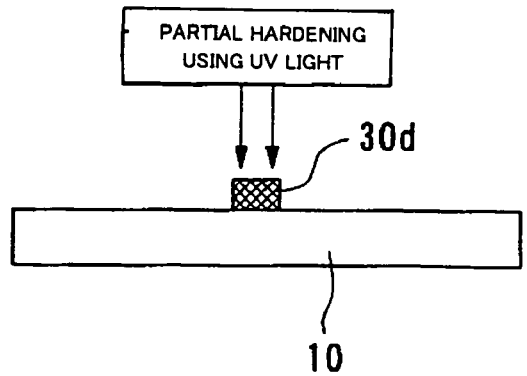

Next, UV light radiates to the liquid photo-curable resin 30c with a desired pattern mask. As a result, only the desired region of the liquid photo-curable resin 30c is hardened to be patterned. Hence, as shown in FIG. 14(b), the optical waveguide 30d made of a hardened optical waveguide material is formed by removing a region of resin not hardened by way of washing or the like.

Figure 15A:
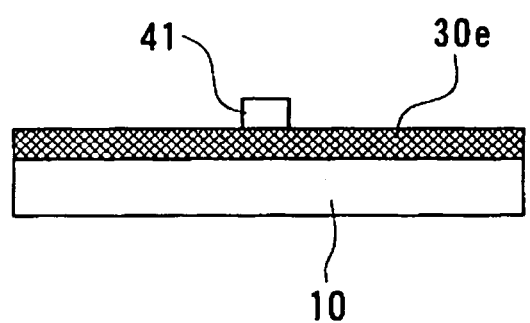
FIGS. 15(A) and 15(B) are schematic side views illustrating another fabricating method according to an exemplary embodiment of the present invention.

FIG. 15 is typical side views illustrating another example of the method of fabricating the optical waveguide 30. First, the first micro-tile shaped element and the second micro-tile shaped element are attached to the top surface of the substrate 10. Then, a process to fabricate the optical waveguide 30 is performed. Then, as shown in FIG. 15(a), resin 30e is coated over the entire top surface of the substrate 10 and the top surfaces of the first micro-tile shaped element and the second micro-tile shaped element (not shown)to be hardened. Such a coating may be performed by a spin coating method, a roll coating method, a spray coating method, and the like. Then, a resist mask 41 is formed at the desired region on the resin 30e. The region on which the resist mask 41 is formed is equal to a region where the optical waveguide 30 is formed.

Figure 15B:
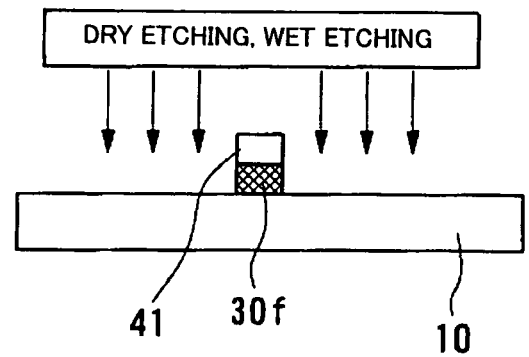

Next, as shown in FIG. 15(b), dry etching or wet etching is performed on the entire substrate 10 with the resist mask 41, and resin 30e, except for a portion under which the resist mask 41 is removed. The optical waveguide 30f made of an optical waveguide material is formed by removing the resist mask 41 through photolithography patterning.

FIG. 16 is typical side views illustrating another example of the method of fabricating the optical waveguide 30. First, the first micro-tile shaped element and the second micro-tile shaped element are attached to the top surface of the substrate 10. Then, the process to fabricate the optical waveguide 30 is performed. Then, the liquid repellent treatment is performed to the entire surface of the substrate 10 and the entire surfaces of the first micro-tile shaped element and the second micro-tile shaped element (not shown) to provide a liquid repellent surface 51.

Figure 16A:
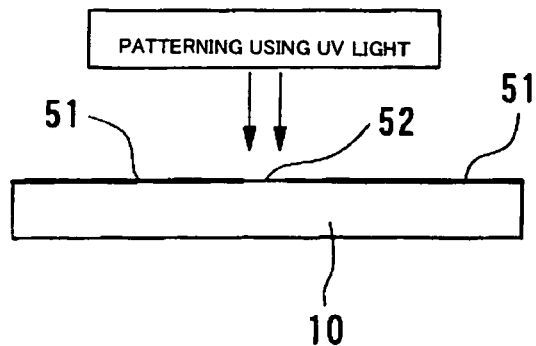
FIGS. 16(A) and 16(B) are schematic side views illustrating another fabricating method according to an exemplary embodiment of the present invention.
Figure 16B:
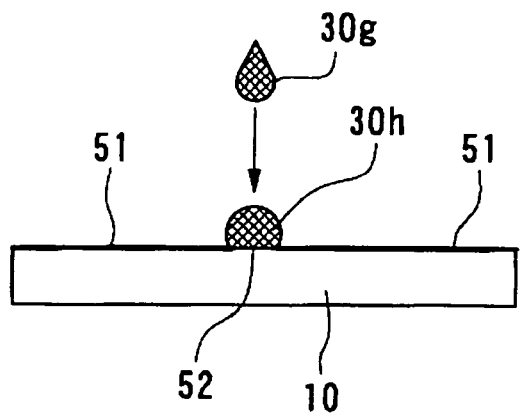

Next, as shown in FIG. 16(a), UV light radiates to the desired pattern region of the liquid repellent surface 51, such that the desired region of the liquid repellent surface 51 can be changed into a lyophilic surface 52. Then, as shown in FIG. 16(b), a liquid optical waveguide material 30g is dropped from an inkjet nozzle, a dispenser, and the like to the lyophilic region 52. Transparent resin or sol gel solution may be used as the optical waveguide material 30g. Then, the optical waveguide 30h made of the optical waveguide material is formed by hardening the optical waveguide material 30g dropped on the substrate 10.

When the optical waveguide material 30g is made of sol gel glass, an acid is added to metal alkoxide, and then hydrolyzed solution is dropped from the inkjet nozzle or the dispenser to the lyophilic surface 52. Then, energy, such as heat, is applied to the dropped solution to make glass, thereby forming an optical waveguide 30h.

FIG. 17 is typical side views illustrating another example of the method of fabricating the optical waveguide 30. First, the first micro-tile shaped element and the second micro-tile shaped element are attached to the top surface of the substrate 10. Then, a process to fabricate the optical waveguide 30 is performed. Hence, as shown in FIG. 17(a), liquid resin 30i is applied over the top surface of the substrate 10 and the top surfaces of the first micro-tile shaped element and the second micro-tile shaped element to cover a region in which the optical waveguide 30 will be formed.

Next, a stamper 51 having a pattern shape 52 of the optical waveguide 30 is pressed into a surface of the substrate 10 from the upper part of the substrate 10. Then, as shown in FIG. 17(b), the stamper 51 is raised from the substrate 10. As a result, by a pattern transfer method using the stamper 51, an optical waveguide 30j made of an optical waveguide material is formed in the desired pattern on the substrate 10.

Other than the exemplary method illustrated in FIGS. 14 to 17, an exemplary method of fabricating the optical waveguide 30 described below may be used. For example, an optical waveguide material forming the optical waveguide 30 may be provided by a printing method, such as a screen printing or an offset printing. The optical waveguide material forming the optical waveguide 30 may be provided by a slit coating method in which liquid resin is discharged from gaps of a slit shape. As the slit coating method, a desired medium, such as resin, may be applied to the substrate 10 by a capillary phenomenon.

Exemplary Method of Fabricating Micro-Tile Shaped Element

Next, an exemplary method of fabricating micro-tile shaped elements including the first micro-tile shaped element 21 and the second micro-tile shaped element 22 will be described with reference to FIGS. 18 to 27. The micro-tile shaped elements of the present exemplary embodiment are fabricated by an epitaxial lift-off technique as its basis. In the present exemplary fabricating method, although a case where a compound semiconductor device (a compound semiconductor element) of the micro-tile shaped element is attached to silicon/LSI chip forming a substrate is described, an aspect of the present invention can be applied regardless of a kind of a semiconductor device or a kind of a LSI chip. In addition, although a "semiconductor substrate" in the present exemplary embodiment represents an advantage made of a semiconductor material, the "semiconductor substrate" is not limited to a plate-shaped semiconductor, but includes a semiconductor material in all kinds of shape.

Figure 18:
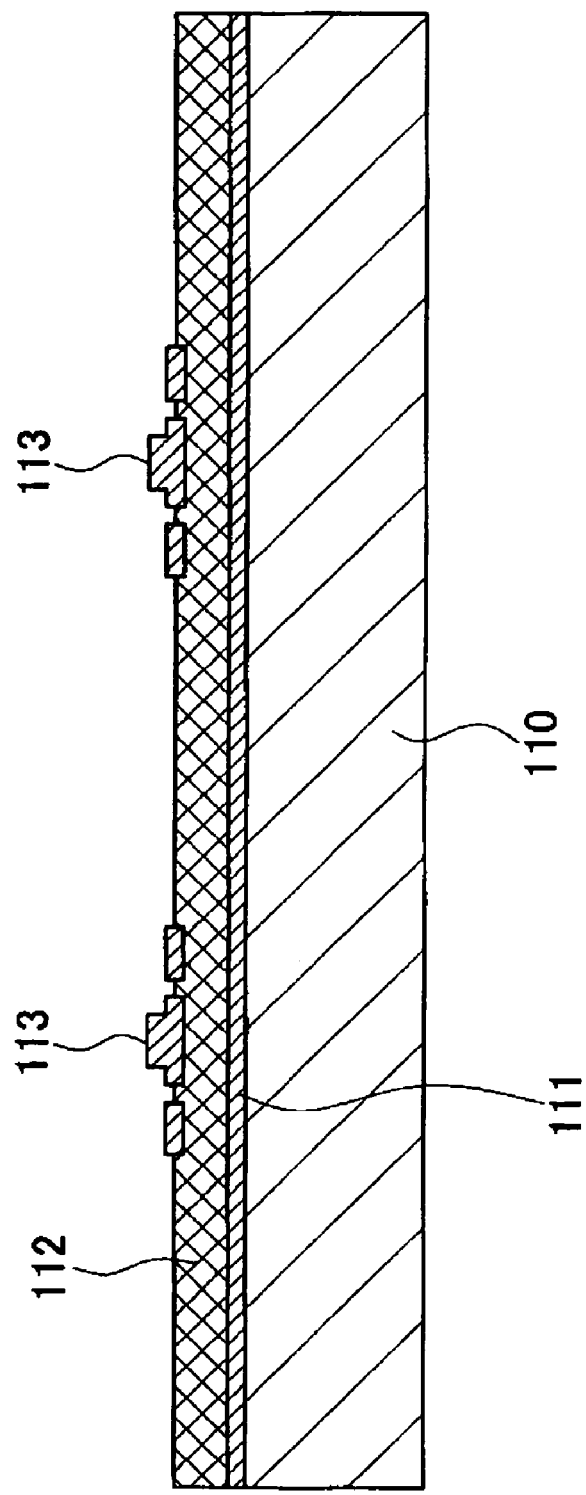
FIG. 18 is a schematic cross-sectional view illustrating a first step of an exemplary method of fabricating micro-tile shaped elements.

FIG. 18 is a schematic sectional view illustrating a first step of an exemplary method of fabricating the micro-tile shaped element. In FIG. 18, a substrate 110 is a semiconductor substrate, e.g., a GaAs compound semiconductor substrate. A sacrifice layer 111 is provided in the lowest layer of the substrate 110. The sacrifice layer 111 is made of AlAs, and its thickness is several hundred nanometers.

For example, a function layer 112 is provided on the upper side of the sacrifice layer 111. The thickness of the function layer 112 is, for example, in the range of 1 to 10(20) micrometers. Hence, a semiconductor device (a semiconductor element) 113 is formed in the function layer 112. The semiconductor device 113 includes a light emitting diode (LED), a vertical cavity surface emitting laser (VCSEL), a photodiode (PD), a DFB laser, and the like. Such a semiconductor device 113 is formed by stacking multi epitaxial layers on the substrate 110. Further, electrodes are formed in the semiconductor device 113 for operation test.

Figure 19:
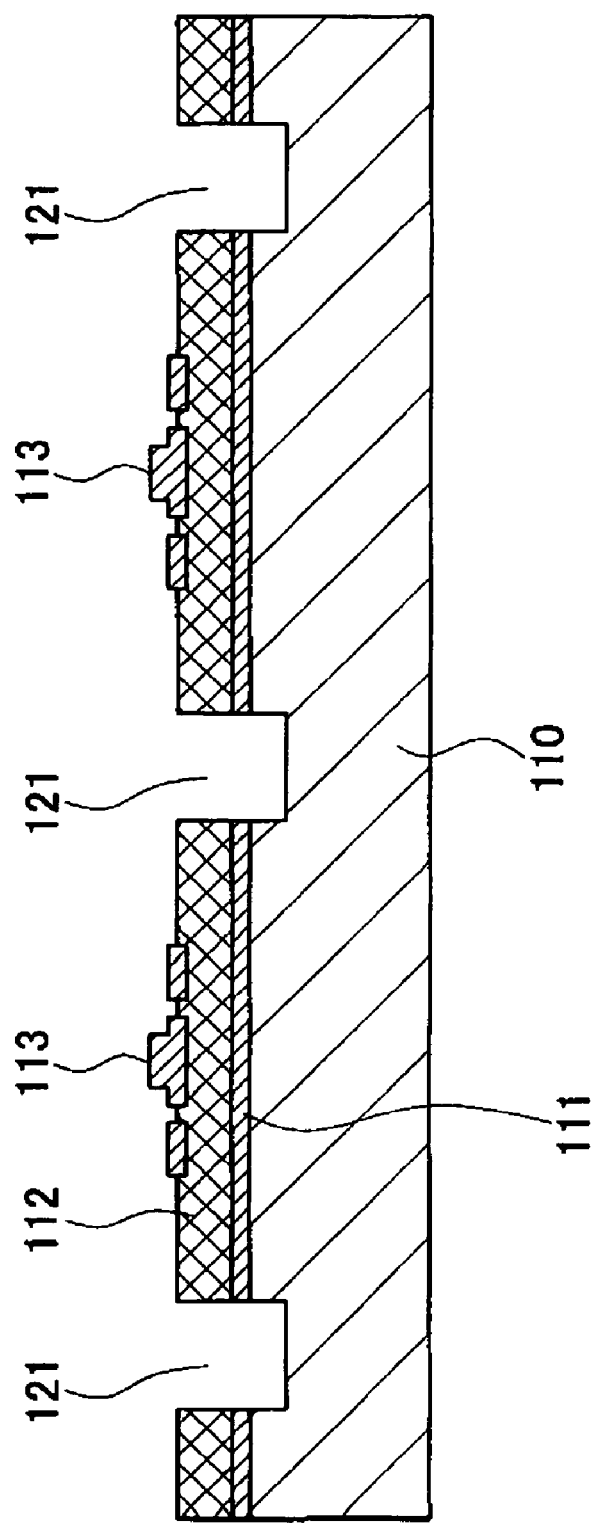
FIG. 19 is a schematic cross-sectional view illustrating a second step of an exemplary method of fabricating the micro-tile shaped elements.

FIG. 19 is a schematic sectional view illustrating a second step of the exemplary method of fabricating the micro-tile shaped element. In the present step, partitioning grooves 121 are formed to partition each semiconductor device 113. The partitioning grooves 121 have a depth at least reachable to the sacrifice layer 111. For example, the width and the depth of the partitioning grooves are all in the range of several ten to several hundred micrometers. Further, the partitioning grooves 121 are formed to be connected to each other such that the selective etching solution, which will be described later, can flow in the partitioning grooves 121. Moreover, it is desirable that the partitioning grooves 121 be formed in a lattice shape.

Further, the distance between the partitioning grooves 121 is set to be in the range of several ten to several hundred micrometers, so that each of the semiconductor device 113 defined by the partitioning grooves 121 can have an area of the range of several ten to several hundred square micrometers. As an exemplary method of fabricating the partitioning grooves 121, a photolithography method and a wet etching or a dry etching method are used. In addition, the partitioning grooves 121 may be formed using U-shaped groove dicing within a range where crack is not generated in a substrate.

Figure 20:
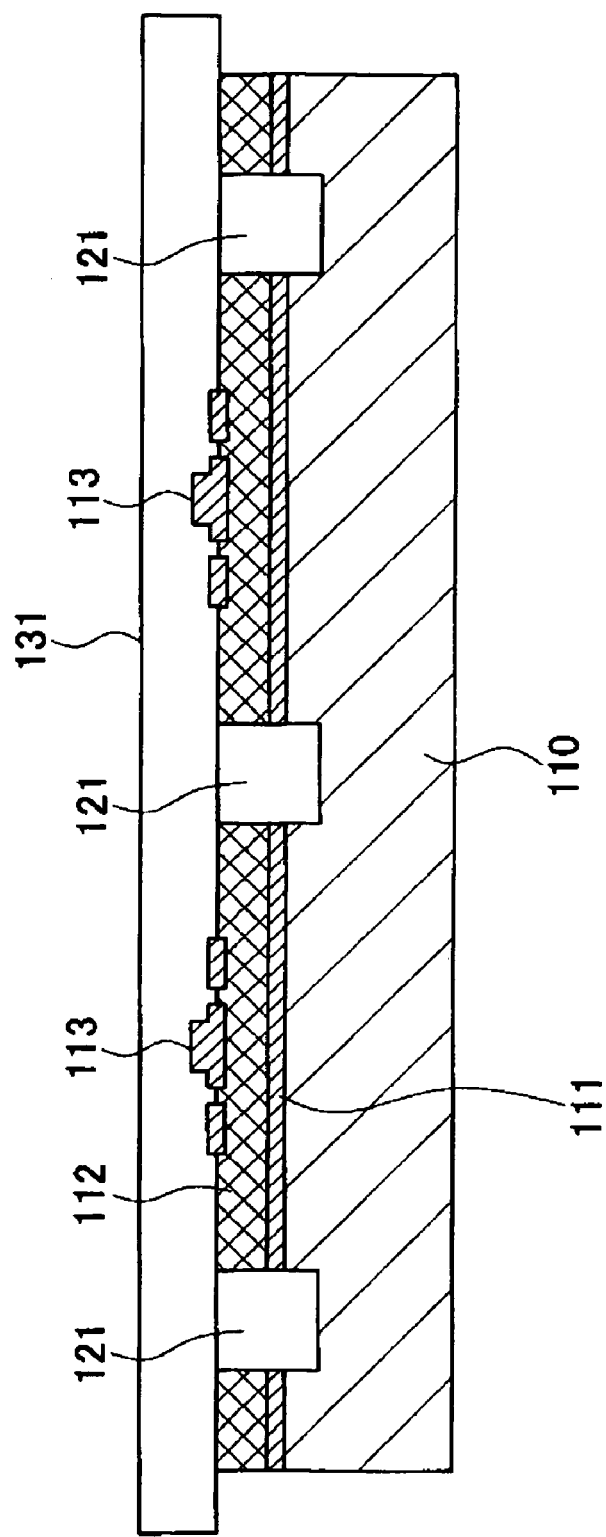
FIG. 20 is a schematic cross-sectional view illustrating a third step of a method of fabricating the micro-tile shaped elements.

FIG. 20 is a schematic sectional view illustrating a third step of the exemplary method of fabricating the micro-tile shaped element. In the present step, an intermediate transfer film 131 is attached to the surface of the substrate 110 (semiconductor device 113 side). The intermediate transfer film 131 is a flexible band-shaped film with its surface coated with adhesion paste.

Figure 21:
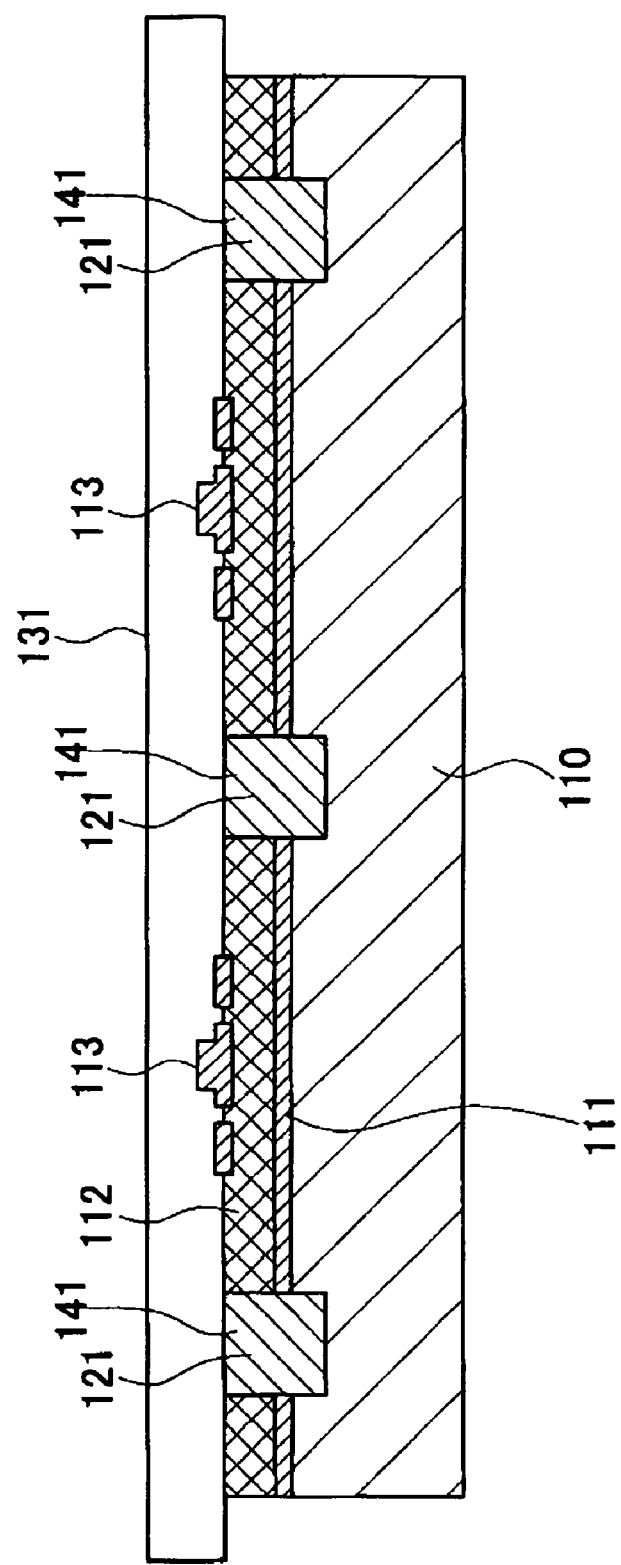
FIG. 21 is a schematic cross-sectional view illustrating a fourth step of an exemplary method of fabricating the micro-tile shaped elements.

FIG. 21 is a schematic sectional view illustrating a fourth step of the exemplary method of fabricating the micro-tile shaped element. In the present step, the selective etching solution 141 is injected into partitioning grooves 121. In the present step, since only the sacrifice layer 111 is selectively etched, the hydrochloric acid of low density, which has high selectivity to aluminum/arsenic, is used as the selective etching solution 141.

Figure 22:
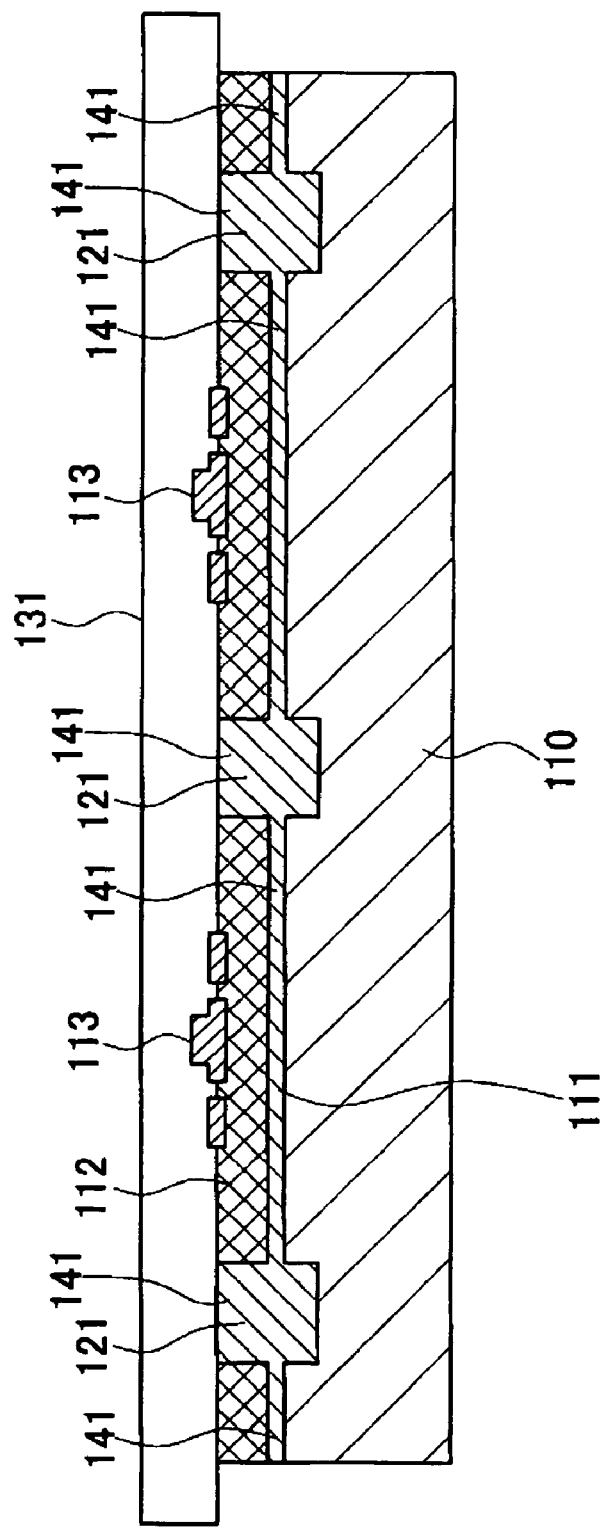
FIG. 22 is a schematic cross-sectional view illustrating a fifth step of an exemplary method of fabricating the micro-tile shaped elements.

FIG. 22 is a schematic sectional view illustrating a fifth step of the exemplary method of fabricating the micro-tile shaped element. In the present step, after injecting the selective etching solution 141 into the partitioning grooves 121 in the fourth step, the whole sacrifice layer 111 is selectively etched and removed from the substrate 110 with the lapse of a predetermined time.

Figure 23:
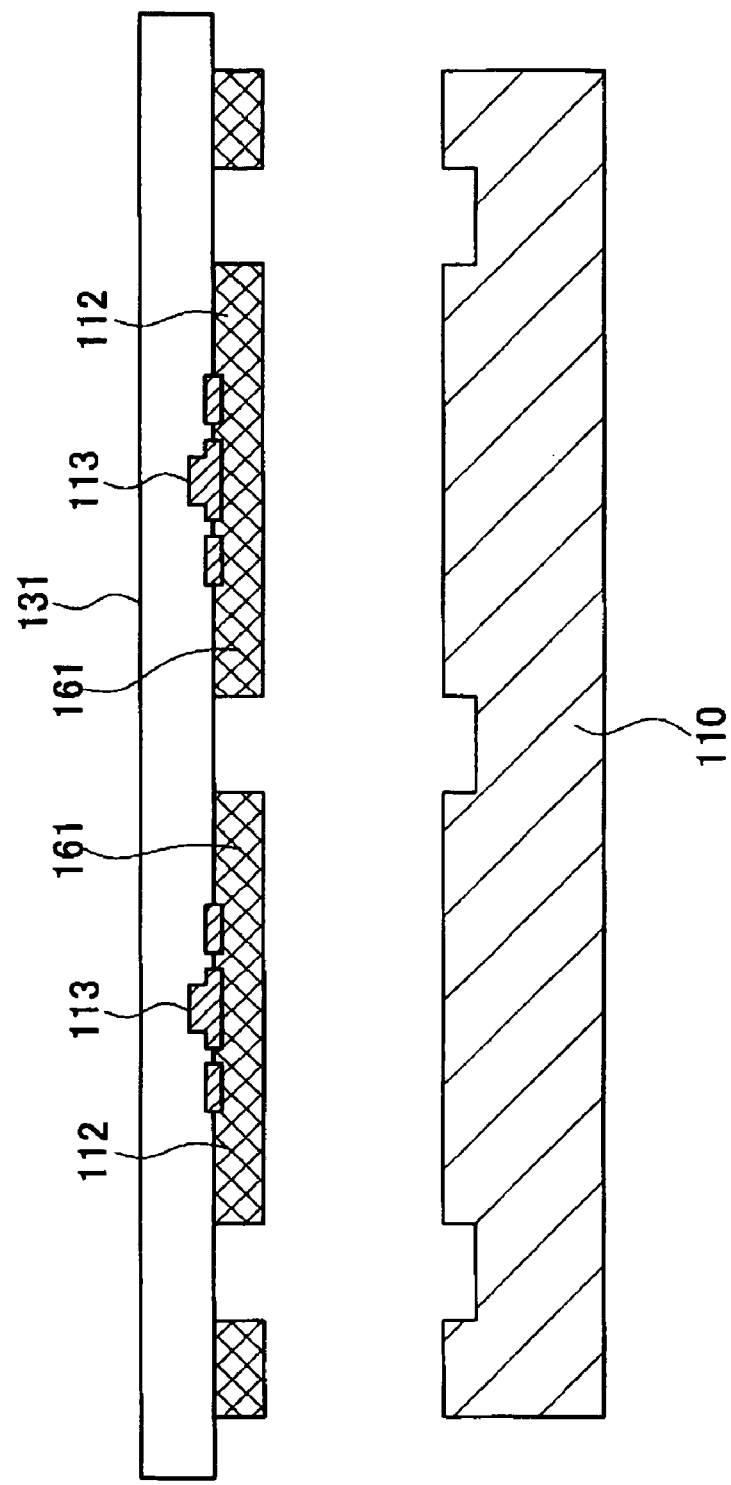
FIG. 23 is a schematic cross-sectional view illustrating a sixth step of an exemplary method of fabricating the micro-tile shaped elements.

FIG. 23 is a schematic sectional view illustrating a sixth step of the exemplary method of fabricating the micro-tile shaped element. The entire sacrifice layer 111 in the fifth step is etched, and then the function layer 112 is detached from the substrate 110. Then, in the present step, the function layer 112, to which the intermediate transfer film 131 is attached, is detached from the substrate 110 by detaching the intermediate transfer film 131 from the substrate 110.

As a result, by forming the partitioning grooves 121 and etching the sacrifice layer 111, the function layer 121, in which semiconductor devices 113 are formed, is segmented to be a semiconductor device ("micro-tile shaped element" of the aforementioned embodiment) having a desired shape (e.g., micro-tile shape) and to adhere to the intermediate transfer film 131. Herein, it is desirable that the function layer should have a thickness of, for example, 1 to 8 $\mu$m and a size (height and width) of, for example, several ten to several hundred micrometers.

Figure 24:
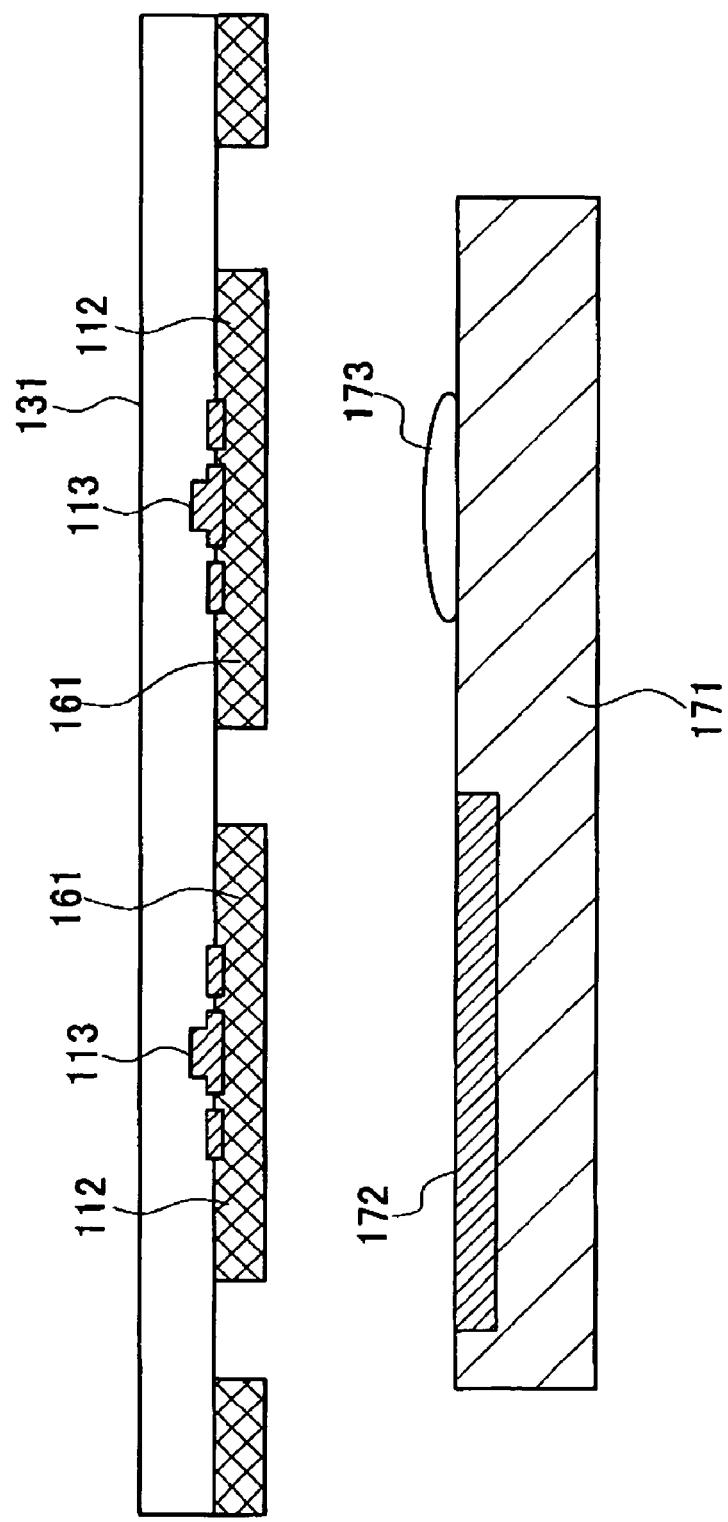
FIG. 24 is a schematic cross-sectional view illustrating a seventh step of an exemplary method of fabricating the micro-tile shaped elements.

FIG. 24 is a schematic sectional view illustrating a seventh step of the exemplary method of fabricating the micro-tile shaped element. In the present step, the intermediate transfer film 131 (to which micro-tile shaped elements 161 are attached) moves to align the micro-tile shaped elements 161 at a desired region of a final substrate 171. Herein, the final substrate 171 is composed of, for example, a silicon semiconductor (the substrate 10 shown in FIG. 1), and an LSI region 172 is formed therein. Further, an adhesive 173 to attach the micro-tile shaped elements 161 is previously applied to a desired region on the final substrate 171.

Figure 25:
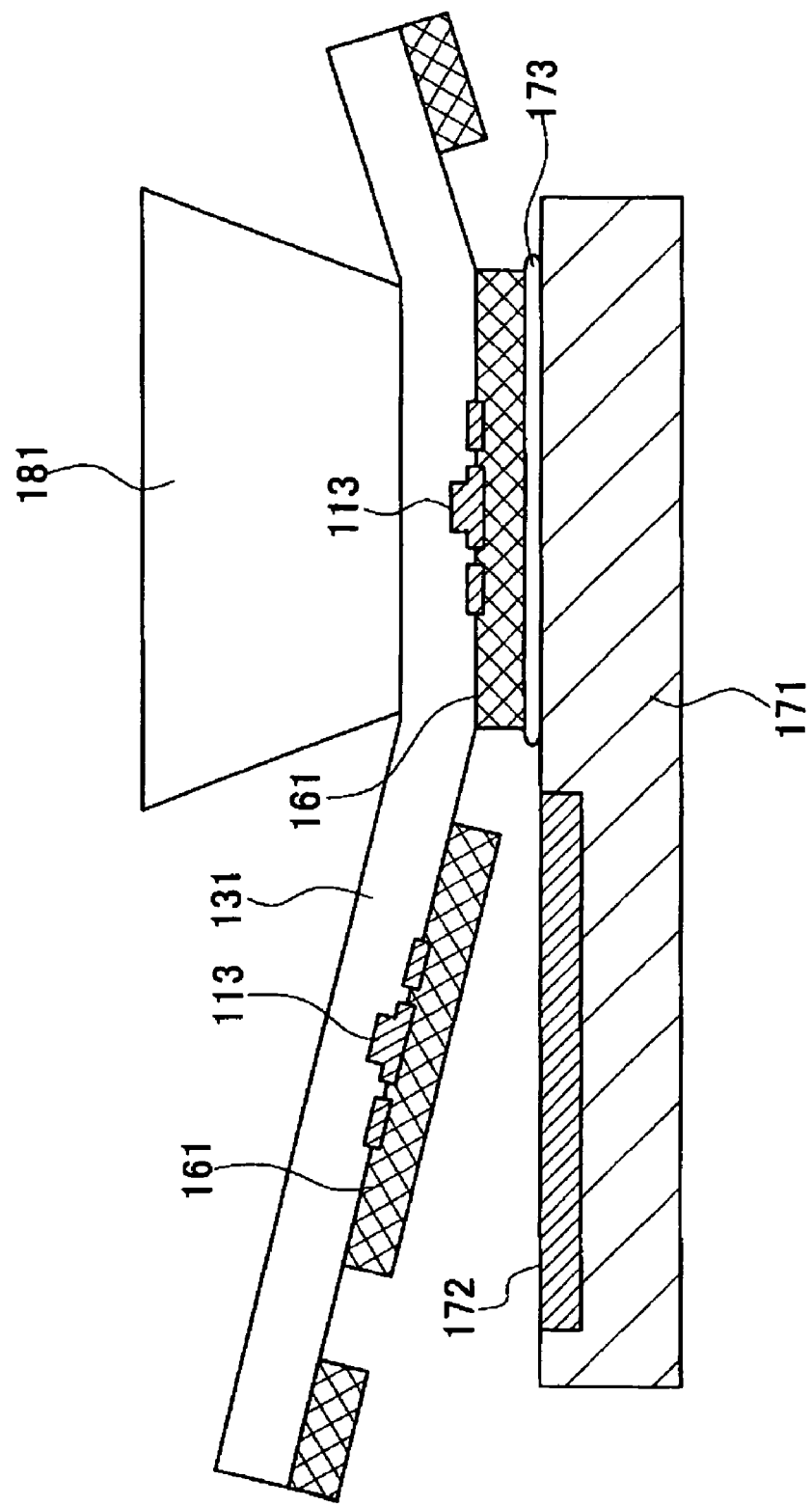
FIG. 25 is a schematic cross-sectional view illustrating an eighth step of an exemplary method of fabricating the micro-tile shaped elements.

FIG. 25 is a schematic sectional view illustrating an eighth step of the exemplary method of fabricating the micro-tile shaped element. In the present step, micro-tile shaped elements 161, which are aligned to the desired portion of the final substrate 171, are pressed by a back pressing pin 181 with the intermediate transfer film 131, thereby adhering to the final substrate 171. Herein, because the adhesive 173 is applied to the desired portion, the micro-tile shaped elements 161 are attached to the desired portion of the final substrate 171.

Figure 26:
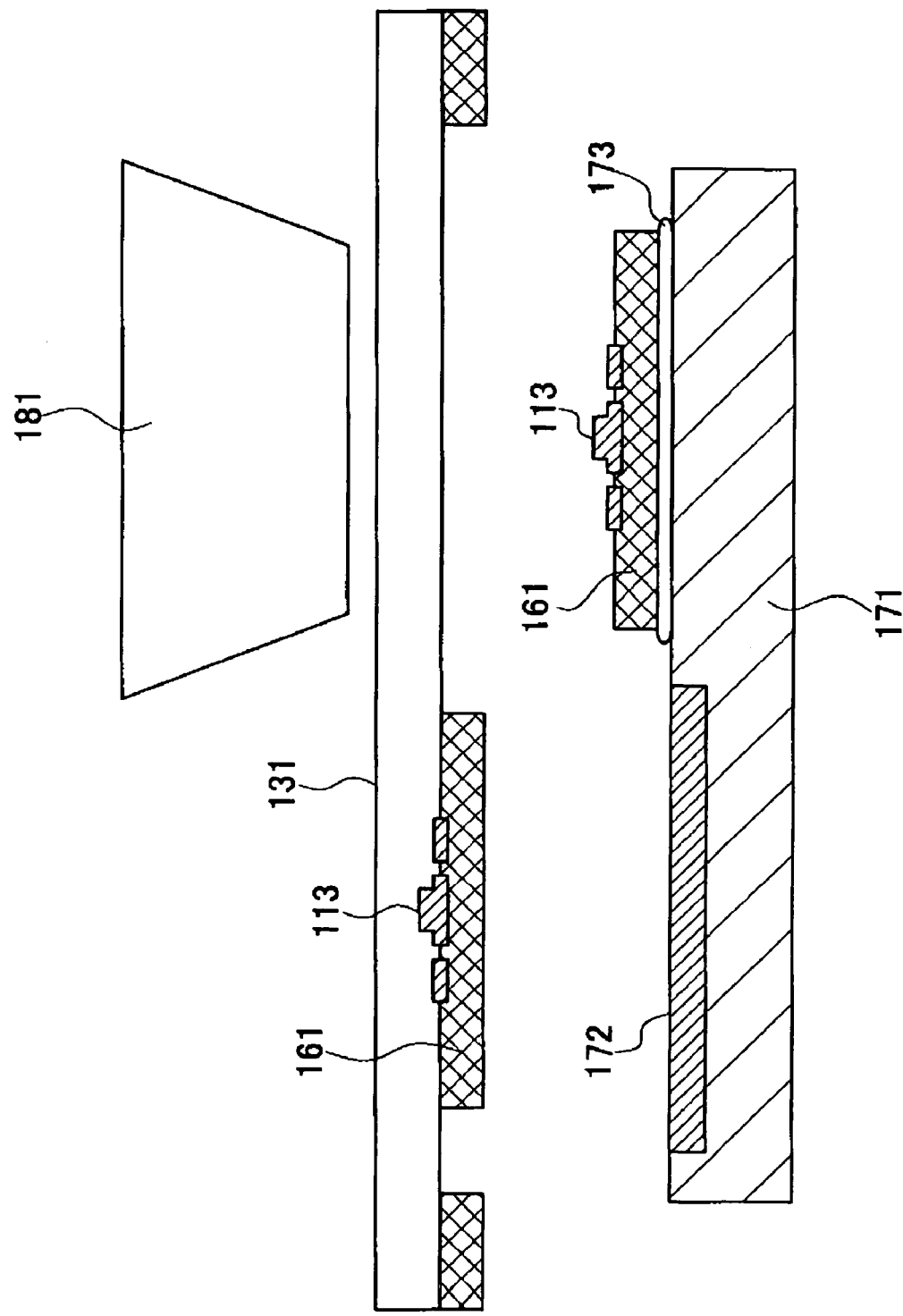
FIG. 26 is a schematic cross-sectional view illustrating a ninth step of an exemplary method of fabricating the micro-tile shaped elements.

FIG. 26 is a schematic sectional view illustrating a ninth step of the exemplary method of fabricating the micro-tile shaped element. In the present step, the intermediate transfer film 131 is detached from the micro-tile shaped elements 161 by vanishing the adhesion of the intermediate transfer film 131.

The adhesion of an adhesive for the intermediate transfer film 131 is vanished by UV light or heat. When using an adhesive having UV curable characteristics, the pin 181 is made of a transparent material, and UV light radiates from the front end of the pin 181, so the adhesion of the intermediate transfer film 131 is vanished. When using an adhesive having thermosetting characteristics, it is preferable to heat the pin 181. Alternatively, after the sixth step, UV light may radiate to the entire surface of the intermediate transfer film 131 to vanish adhesiveness completely. Although the adhesion is vanished, a little adhesiveness remains, and the micro-tile shaped elements 161 are very thin and light. Thus, the micro-tile shaped elements 161 are attached to the intermediate transfer film 131.

The present step is not shown. In the present step, the micro-tile shaped elements 161 are attached to the final substrate 171 by a thermal processing.

Figure 27:
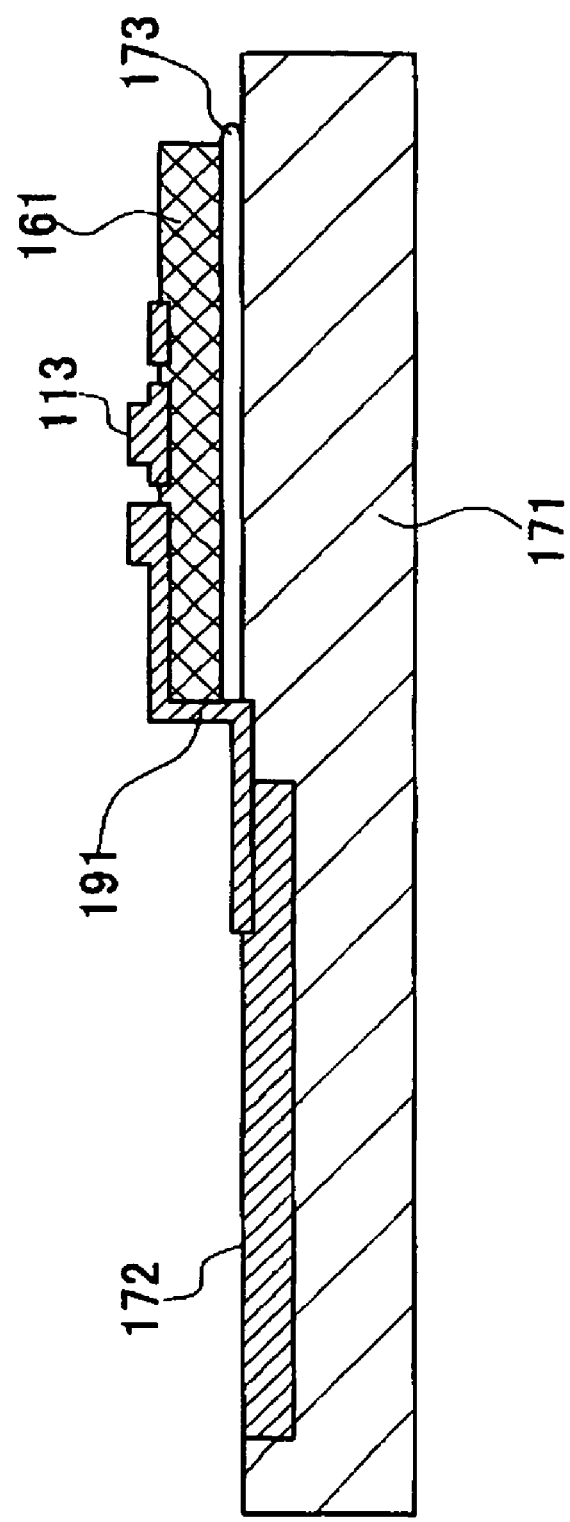
FIG. 27 is a schematic cross-sectional view illustrating an eleventh step of an exemplary method of fabricating the micro-tile shaped elements.

FIG. 27 is a schematic sectional view illustrating an eleventh step of the exemplary method of fabricating the micro-tile shaped element. In the present step, the electrode of the micro-tile shaped element 161 is electrically connected through wiring 191 to circuits on the final substrate 171 to form one LSI chip (an integrated circuit chip for an optical interconnection circuit). A quartz substrate or a plastic film as well as a silicon semiconductor may be used as the final substrate 171.

Example of Application

Hereinafter, an example of the application of the optical interconnection circuit among wavelength multiplexing chips according to an aspect of the present invention will be described.

For example, the on-chip optical interconnection circuits of the above-described exemplary embodiments are used as a signal transmission device of an optoelectronics integrated circuit system. A computer is used as the optoelectronics integrated circuit system. Next, integrated circuit chips constituting a CPU are formed on the substrate 10, and integrated circuit chips constituting a storage device are formed on the substrate 10. Although signal processing in the CPU and the storage device is performed using electrical signals, the optical interconnection circuit among wavelength multiplexing chips of the above-described exemplary embodiment is applied to the data transmission between IC chips.

As a result, in accordance with the present application in simple and easy configuration, it is possible to greatly enhance the signal transmission speed of a bus, which has become bottleneck in a computer processing speed, as compared with the related art. Further, according to the present application, it is possible to make thinner and to miniaturize such computer system in a large range.

Electronic Apparatus

An electronic apparatus having a flat panel display or an optical interconnection circuit among wavelength multiplexing chips of the above-described exemplary embodiments will be described.

Figure 28:
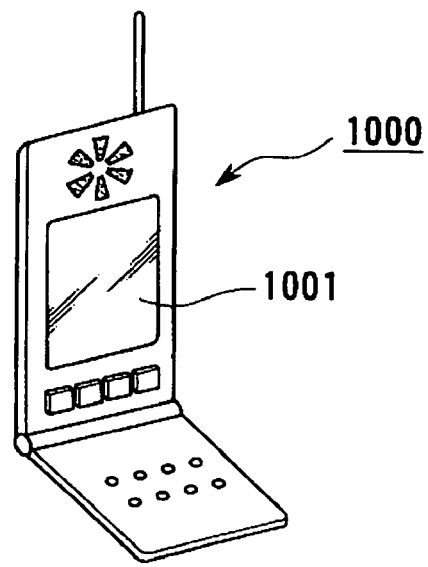
FIG. 28 is a view illustrating an example of an electronic apparatus including the circuit according to the present exemplary embodiments.

FIG. 28 is a perspective view illustrating an example of a cellular phone. In FIG. 28, reference numeral 1000 represents a body of a cellular phone using the above-described optical interconnection circuit among wavelength multiplexing chips, and reference numeral 1001 represents a display part using the above-described flat panel display (an electro-optical device).

Figure 29:
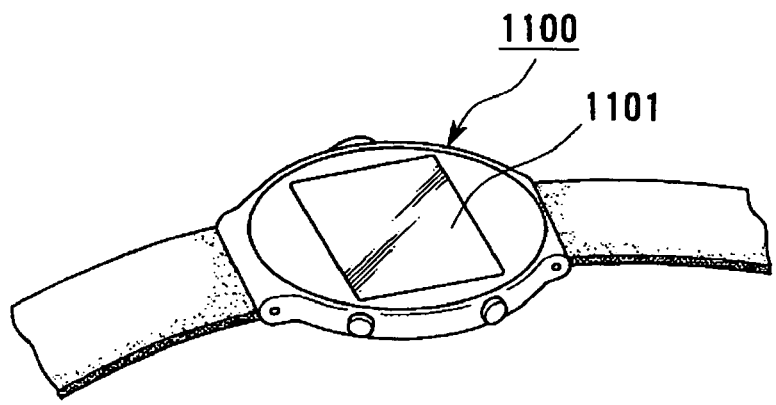
FIG. 29 is a view illustrating another example of an electronic apparatus including the circuit according to the present exemplary embodiments.

FIG. 29 is a perspective view illustrating an example of a wristwatch type electro-optical apparatus. In FIG. 29, reference numeral 1100 represents a body of a watch using the above-described optical interconnection circuit among wavelength multiplexing chips, and reference numeral 1101 represents a display part using the above-described flat panel display (an electro-optical device).

Figure 30:
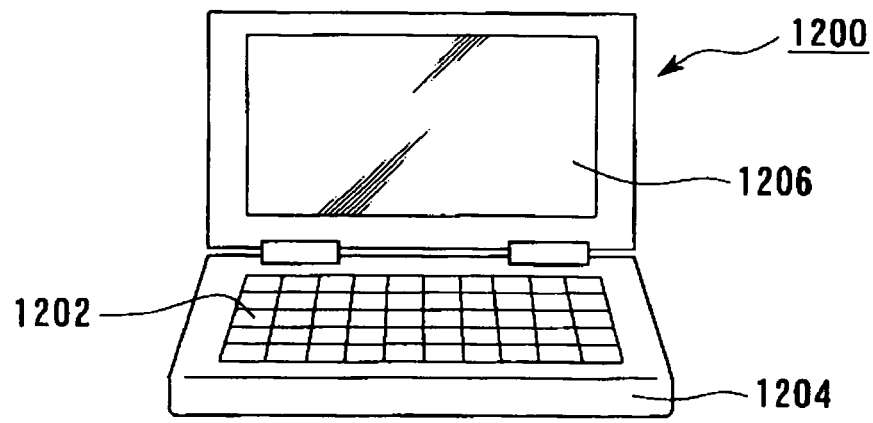
FIG. 30 is a view illustrating still another example of an electronic apparatus including the circuit according to the present exemplary embodiments.

FIG. 30 is a perspective view illustrating an example of a portable information processing device, such as a word-processor or PC. In FIG. 30, reference numeral 1200 represents an information processing device, reference numeral 1202 represents an input part, such as a keyboard, reference numeral 1204 represents a body of the information processing device using the above-described optical interconnection circuit among wavelength multiplexing chips, and reference numeral 1206 represents a display part using the above-described flat panel display (an electro-optical device).

Since the electronic apparatus shown in FIGS. 28 to 30 have the above-described optical interconnection circuit among wavelength multiplexing chips or the above-described flat panel display, it is possible to achieve an electronic apparatus having a display part with a high display quality, high response speed, and the bright and large screen. Further, as compared with the related art, it is possible to achieve a thin and small electronic apparatus using the above-described optical interconnection circuit among wavelength multiplexing chips. Moreover, it is possible to reduce fabricating costs using the above-described optical interconnection circuit among wavelength multiplexing chips.

Further, the scope of the invention is not limited to the above-described exemplary embodiments, and various modifications can be made without departing from the spirit or scope of the present invention. It is also intended that specific materials or configurations illustrated in the embodiments are only examples and suitable modifications can be made.

What is claimed is:

1. An optical interconnection circuit among wavelength multiplexing chips comprising:
   a substrate,
   a micro-tile shaped elements disposed on the substrate having a light emitting function or a light receiving function with wavelength selectivity; and
   optical waveguides disposed on the substrate and optically connected to the micro-tile shaped elements.

2. The optical interconnection circuit among wavelength multiplexing chips according to claim 1,
   the optical waveguides including branches and being made of resin.

3. The optical interconnection circuit among wavelength multiplexing chips according to claim 1,
   the micro-tile shaped elements having the light emitting function being optically connected to one of the optical waveguides, and
   the micro-tile shaped elements with the light emitting function having different emitted light wavelengths.

4. The optical interconnection circuit among wavelength multiplexing chips according to claim 3,
   the micro-tile shaped elements having the light emitting function simultaneously inputting optical pulse signals having a plurality of emitted light wavelengths to one of the optical waveguides.

5. The optical interconnection circuit among wavelength multiplexing chips according to claim 1,
   the micro-tile shaped elements having the light receiving function being optically connected to one of the optical waveguides, and
   the micro-tile shaped elements with the light receiving function having different received light wavelengths.

6. The optical interconnection circuit among wavelength multiplexing chips according to claim 1, integrated circuit chips being mounted on the substrate, and
   the integrated circuit chips and the micro-tile shaped elements being electrically connected to each other by wiring lines on the substrate.

7. The optical interconnection circuit among wavelength multiplexing chips according to claim 6, the integrated circuit chips being mounted on the substrate by a flip-chip technique.

8. The optical interconnection circuit among wavelength multiplexing chips according to claim 6,
   the substrate being a constituent of a flat panel display,
   at least timing-control integrated circuits and driver integrated circuits being mounted on the substrate as the integrated circuit chips, and
   the optical waveguides being disposed to connect the timing-control integrated circuits to the driver integrated circuits.

9. The optical interconnection circuit among wavelength multiplexing chips according to claim 8,
   the driver integrated circuits being mounted on the substrate, and
   each of the driver integrated circuits including a branch in the optical waveguide.

10. The optical interconnection circuit among wavelength multiplexing chips according to claim 8, the timing-control integrated circuits including the micro-tile shaped elements having the light emitting function, and
    the micro-tile shaped elements having the light emitting function emit light components having different wavelengths and being optically connected to common optical waveguides.

11. The optical interconnection circuit among wavelength multiplexing chips according to claim 9, the driver integrated circuits including the micro-tile shaped elements having different received light wavelengths.

12. An electro-optical device, comprising: the optical interconnection circuit among the wavelength multiplexing chips according to claim 1.

13. An electronic apparatus, comprising:
    the optical interconnection circuit among the wavelength multiplexing chips according to claim 1.

14. The optical interconnection circuit among wavelength multiplexing chips according to claim 1, the optical waveguides covering the micro-tile shaped elements.

* * * * *